US006396517B1

(12) United States Patent
Beck et al.

(10) Patent No.: US 6,396,517 B1
(45) Date of Patent: May 28, 2002

(54) INTEGRATED TRIGGER FUNCTION DISPLAY SYSTEM AND METHODOLOGY FOR TRIGGER DEFINITION DEVELOPMENT IN A SIGNAL MEASUREMENT SYSTEM HAVING A GRAPHICAL USER INTERFACE

(75) Inventors: Douglas James Beck; Clarence Keith Griggs; Jeffrey Erickson Roeca, all of Colorado Springs; Jeffrey John Haeffele, Monument; Mason Bradfield Samuels, Colorado Springs, all of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/261,313

(22) Filed: Mar. 1, 1999

(51) Int. Cl.[7] .............................. G06F 3/14; G06F 17/00
(52) U.S. Cl. ...................... 345/771; 345/773; 345/835; 345/839; 345/769; 702/57; 702/66; 702/67; 702/68; 702/117
(58) Field of Search .............................. 345/440.1, 771, 345/773, 965, 835, 839, 769; 702/57, 66, 67, 68, 117

(56) References Cited

U.S. PATENT DOCUMENTS

| | | | |
|---|---|---|---|
| 4,475,237 A | 10/1984 | Glasby | 382/10 |
| 4,513,395 A | 4/1985 | Henry et al. | 364/900 |
| 4,541,100 A | 9/1985 | Sutton et al. | 375/10 |
| 4,559,636 A | 12/1985 | Goldrian | 377/20 |
| 4,623,984 A | 11/1986 | Yokokawa et al. | 364/900 |
| 4,636,940 A | 1/1987 | Goodwin, Jr. | 364/200 |

(List continued on next page.)

OTHER PUBLICATIONS http.//docs.hp.com/svyhlp12/Main16700/helpMain16700.html#_hometopic; HP 16600A/16700A Series Logic Analysis System; pp. 1–2; date unknown.
http://docs.hp.com/svyhlp12/MeasEx/TriggerMacros.html#TriggerMacros; Use trigger macros for easy measurement set up (for HP 16600A/16700A Series Logic Analysis System); pp. 1–2; date unknown.
http://docs.hp.com/svyhlp12/MeasEx/BreakDownMac.html#BreakDownMac; Modify trigger macros to build new measurements (for HP 16600A/16700A Series Logic Analysis System); pp. 1–2; date unknown.

*Primary Examiner*—Crescelle N. Dela Torre
*Assistant Examiner*—Thomas T. Nguyen

(57) ABSTRACT

An integrated trigger function display system and methodology for trigger definition development in a signal measurement system having a graphical user interface. The system contemporaneously displays one or more trigger function names and an associated trigger function descriptor describing a trigger function identified by the associated trigger function name. The trigger name is displayed in a trigger name display region of a display window that concurrently displays a plurality of trigger function names. The descriptor is displayed in a trigger descriptor region of the display window so as to be visually-associated by the operator. A trigger definition is comprised of one or more trigger functions. Each trigger function is a graphical representation of an one or more underlying trigger primitives. A trigger primitive is a computer program statement that is translated into a form suitable for controlling the signal measurement system. Trigger primitives comprise one or more trigger branches used to form a sequence level of the trigger definition. For a selected trigger function, either the trigger function or its underlying trigger primitives are displayed in a trigger definition region of the display window for editing by the operator. Preferably, multiple such trigger functions or primitives may be selected and displayed simultaneously or sequentially to form a desired trigger definition.

35 Claims, 14 Drawing Sheets

U.S. PATENT DOCUMENTS

| | | | |
|---|---|---|---|
| 4,654,848 A | 3/1987 | Noguchi | 371/20 |
| 4,701,918 A | 10/1987 | Nakajima et al. | 371/20 |
| 4,730,314 A | 3/1988 | Noguchi | 371/16 |
| 5,031,128 A | 7/1991 | Boutigny et al. | 364/715.11 |
| 5,067,130 A | 11/1991 | Jackson | 371/22.1 |
| 5,371,851 A * | 12/1994 | Pieper et al. | 395/507 |
| 5,446,650 A | 8/1995 | Overhage et al. | 364/487 |
| 5,611,044 A | 3/1997 | Lundeby | 395/183.14 |
| 5,892,948 A * | 4/1999 | Aoki et al. | 395/701 |
| 5,953,009 A * | 9/1999 | Alexander | 345/348 |
| 6,262,728 B1 * | 7/2001 | Alexander | 345/334 |
| 6,327,544 B1 * | 12/2001 | Samuels | 702/70 |

* cited by examiner

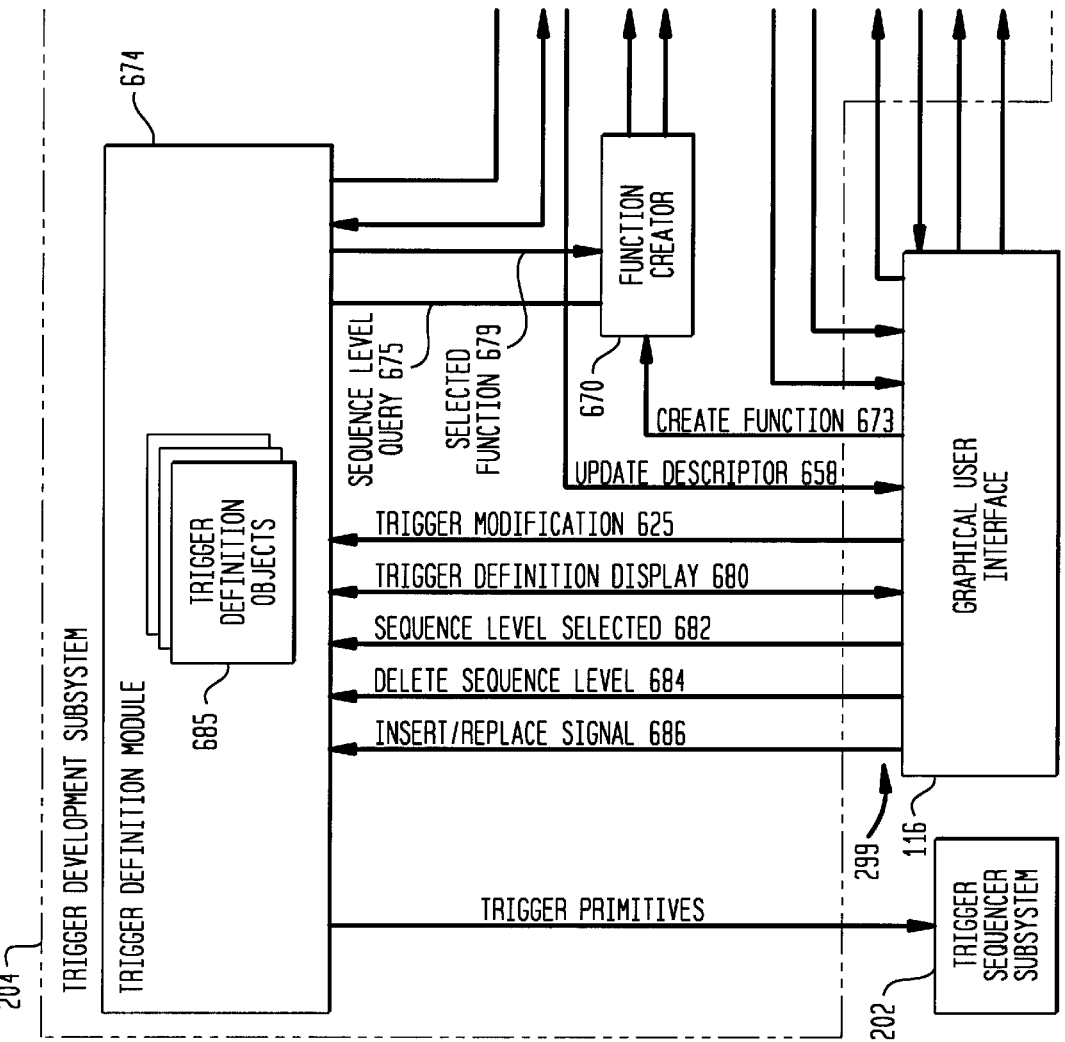
FIG. 6A1

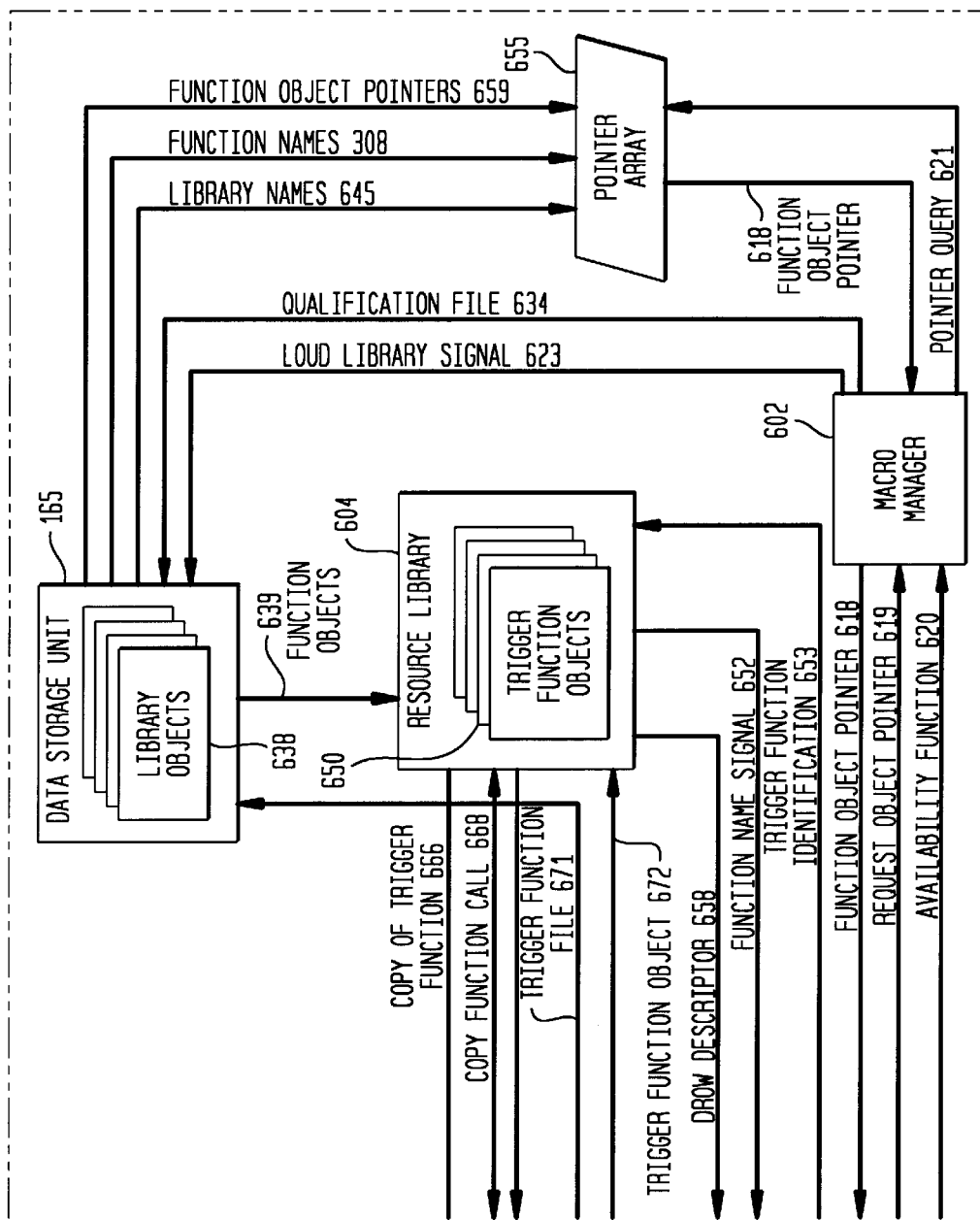
FIG. 6A2

| LIBRARY NAME | TRIGGER FUNCTION NAME | FUNCTION OBJECT NAME |
|---|---|---|
| LIBRARY 1 | TRIGGER FUNCTION 1 | ADDRESS |
| ⋮ | ⋮ | ⋮ |
| | | |

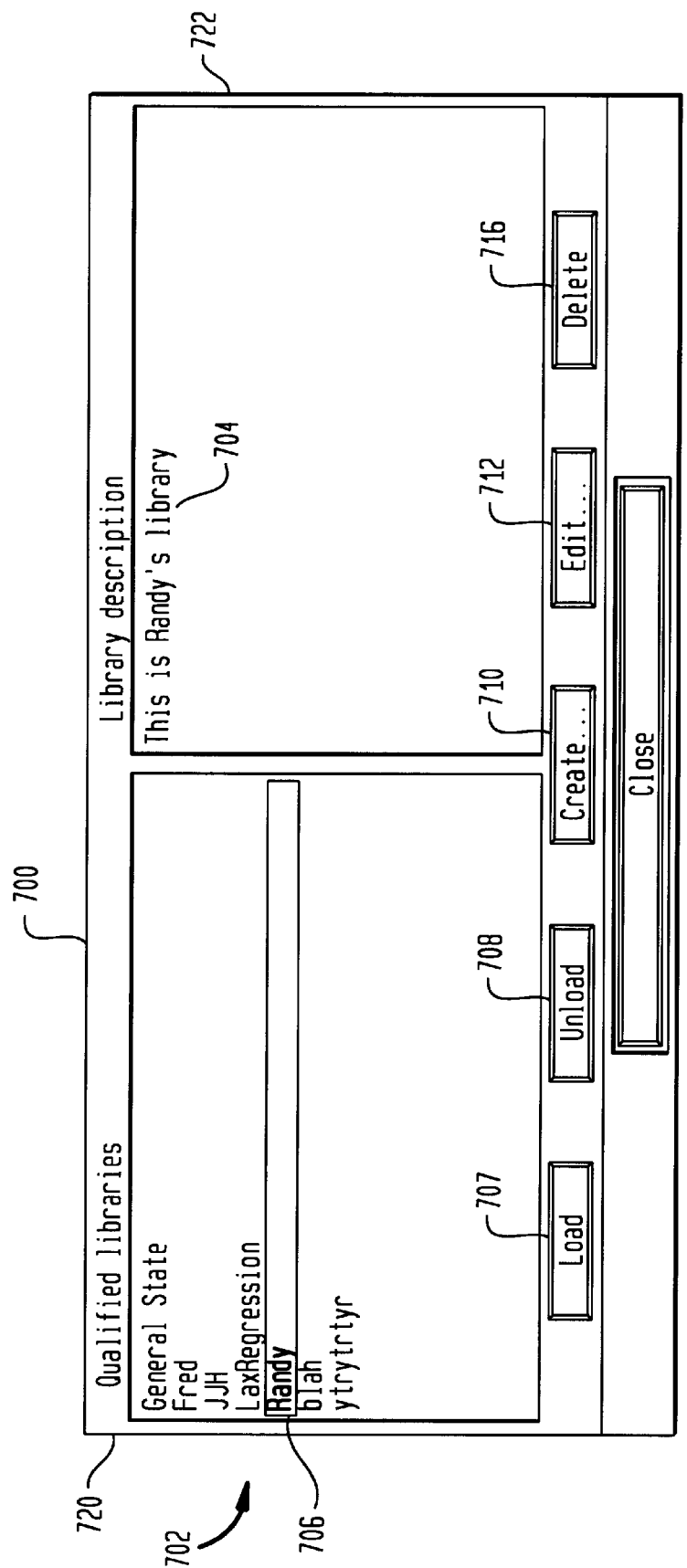

INTEGRATED TRIGGER FUNCTION DISPLAY SYSTEM AND METHODOLOGY FOR TRIGGER DEFINITION DEVELOPMENT IN A SIGNAL MEASUREMENT SYSTEM HAVING A GRAPHICAL USER INTERFACE

BACKGROUND OF THE INVENTION

1. Field of the Invention

The present invention relates generally to signal measurement systems and, more particularly, to generating trigger definitions in a signal measurement system.

2. Related Art

Analyzers and testers are commonly available to assist in the development, manufacturing and troubleshooting of complex digital electronic/software devices and integrated circuits having incorporated therein microprocessors, random-access memories (RAM), read-only memories (ROM), and other circuits. Such analyzers and testers, generally referred to as signal measurement systems include logic analyzers, digital oscilloscopes, protocol analyzers, microprocessor emulators, bit error rate testers, network analyzers, among other instruments. Logic analyzers in particular have emerged for this purpose and are commercially available from a number of vendors, such as Hewlett-Packard Company, Tektronix, Inc., and others.

Logic analyzers are digital data acquisition instruments that allow an operator to acquire and display digital signal data from a large number of logic signals ("signals"), such as those that travel over address, data and control lines of a device under test (DUT). A device under test may include one or more separately packaged devices such as those noted above as well as other circuits and devices.

The signals are acquired from the device under test on hardwired lines referred to as channels. The channels may be physically assembled into groups commonly referred to as pods. The received signals are sampled and digitized to form signal data. Digitizing typically includes comparing a voltage magnitude of each logic signal sample to a reference voltage to determine the logic state of the signal. Sampling may occur at one of a number of selectable rates, depending on the frequency at which the sampled signals change logic states. The resultant signal data are stored, under the control of a sampling clock, in a signal data memory generally having a fixed size. The data are typically stored in a sequential manner such that consecutive signal samples are stored in consecutive memory locations. Due to the quantity of signal data, signal data memory is commonly implemented as a wrap-around buffer.

Selection of the signal data to be subsequently presented on a display is determined by an operator-defined trigger specification. The trigger specification (also referred to as a trigger set-up) is specified generally by a trigger definition, and a number of parameters collectively referred to herein as trigger control parameters or, simply, trigger controls. The trigger definition identifies the occurrences that result in signal data being stored. The trigger controls identify the characteristics of the captured signal data including, for example, the relative position of the occurrence defined by the trigger definition and the signal data to be stored. A predetermined quantity of signal data occurring before and after the specified occurrence is then stored in memory for subsequent analysis.

A trigger definition, also referred to as a trigger sequence, is comprised of one or more trigger sequence levels. Each sequence level may include any number of trigger branches each of which sets forth a branch condition that causes the logic analyzer to execute the action defined in that trigger branch. Such execution results in the storage of signal data or further processing of a subsequent sequence level. The final branch condition that causes the acquisition of signal data is commonly referred to as a trigger condition.

Branch conditions are specified by the occurrence of one or more events. An event is defined as an occurrence of certain characteristics or properties of a signal, such as a rising or falling edge of a signal, a logic high or logic low signal state, etc. Events may also be defined based on internal resources, such internal timers, counters, etc. Typically, a branch condition specifies a number of events that occur simultaneously or in a relative time sequence.

After the trigger specification is specified, the operator can perform a measurement; that is, initiate acquisition of signal samples. When signal data capture is initiated, the signal data is compared to the specified trigger definition. When the trigger definition is satisfied, signal data is captured in accordance with the specified trigger controls and stored in signal data memory. Subsequently, the signal data memory may be sequentially accessed and signal data memory displayed.

Constructing a trigger definition can be very complicated and time consuming. Conventionally, trigger definitions are expressed in an esoteric trigger programming language. Learning such a programming language is often difficult; proficiency often requires many years of practice. However, even with such proficiency and knowledge, formulation of even simple trigger definitions still requires considerable time and effort due to the complexity of the programming language. In other words, such programming languages, although suited for development of complicated trigger definitions, are burdensome to developing simple and complicated trigger definitions alike.

SUMMARY OF THE INVENTION

The present invention is an integrated trigger function display system and methodology for trigger definition development in a signal measurement system having a graphical user interface. The present invention contemporaneously displays one or more trigger function names and an associated trigger function descriptor describing a trigger function identified by the associated trigger function name. The trigger name is displayed in a trigger name display region of a display window that concurrently displays a plurality of trigger function names. The descriptor is contemporaneously displayed in a trigger descriptor region of the display window so as to be visually-associated with the associated trigger name by the operator.

A trigger definition is comprised of one or more trigger functions. Each trigger function is a graphical representation of an underlying one or more trigger primitives. A trigger primitive is translated into a form suitable for controlling the signal measurement system. Trigger primitives comprise one or more trigger branches used to form a sequence level of the trigger definition. For a selected trigger function, either the trigger function or its underlying trigger primitives are displayed in a trigger definition region of the display window for editing by the operator. Preferably, multiple such trigger functions or primitives may be selected and displayed in a trigger definition region on the display window simultaneously or sequentially to form a desired trigger definition.

A number of aspects of the invention are summarized below, along with different embodiments of each of the summarized aspects. It should be understood that the embodiments are not necessarily inclusive or exclusive of each other and may be combined in any manner that is non-conflicting and otherwise possible, whether they be presented in association with a same or different aspect of the invention. It should also be understood that these summarized aspects of the invention are exemplary only and are considered to be non-limiting.

In one aspect of the invention, an integrated trigger function display system for trigger definition development in a signal measurement system having a graphical user interface is disclosed. The trigger function display system is constructed and arranged to contemporaneously display in a visually-associated manner a trigger function name and an associated trigger function descriptor. The trigger function name identifies an associated trigger function while the descriptor provides additional description of the trigger function identified by the associated trigger function name. The trigger name is displayed in a trigger name region of a display window that concurrently displays a plurality of trigger function names. The descriptor is displayed in a trigger descriptor region of display window. In one embodiment, a trigger definition region is contemporaneously displayed in the display window for editing by the operator. For a selected trigger function, either a trigger function display or one or more underlying trigger primitives comprising the selected trigger function is displayed.

In one embodiment, the integrated trigger function display system includes a trigger function resource library including a plurality of predefined trigger function objects. Each trigger function object includes a trigger function name, one or more trigger primitives, and a corresponding trigger function display for representing one or more trigger primitives on the graphical user interface, and a trigger function descriptor associated with the trigger function object. The library also includes a trigger definition maintenance module constructed and arranged to maintain copies of selected trigger function objects that form a current trigger definition and to convert the selected trigger functions to a trigger primitive form for subsequent translation to a form suitable for capturing signal data in the signal measurement system.

In another aspect of the invention, a trigger development system for trigger definition development in a signal measurement system having a graphical user interface is disclosed. The trigger function display system is constructed and arranged to contemporaneously display in an operatively integrated and visually-associated manner, a trigger name display region, an associated trigger function descriptor and a trigger definition region. A trigger function name is displayed in the trigger name display region. An associated trigger function descriptor describing a trigger function identified by the associated trigger function name is displayed in the descriptor display region. A trigger function is displayed in a trigger definition region of display window for editing, wherein a trigger function is generated in the trigger definition display window in response to an operator selection on the trigger function name display region or the trigger descriptor display region on graphical user interface.

In a still further aspect of the invention, a trigger display system for trigger definition development in a signal measurement system having a graphical user interface is disclosed. The trigger display system displays a trigger name region having names corresponding to electable trigger functions and a trigger definition region including a first trigger definition comprising a plurality of selected trigger functions displayed in corresponding sequence levels, one or more of multiple sequence levels designated to comprise a user-created trigger function wherein the operator-created trigger function is configured to be a selectable trigger function and wherein selection of user-created trigger function results in inclusion of one or more sequence levels in a second trigger definition.

In another aspect of the invention, a method for providing a trigger development environment in a signal measurement system that acquires signal data in accordance with a trigger definition is disclosed. The signal measurement system includes a graphical user interface and a data storage unit. The method includes a step of: a) displaying contemporaneously on the graphical user interface a trigger name region having a plurality of trigger function names displayed therein, each trigger name identifying an associated trigger function, and a trigger descriptor region operatively coupled to the trigger names display region and having a first trigger function descriptor displayed therein, wherein the trigger function descriptor is visually associated with an identified one of plurality of trigger function names displayed within trigger names display region.

In one embodiment, step a) further includes the step of: 1) displaying in trigger descriptor region a second trigger function descriptor visually associated with a second of plurality of trigger function names in response to a user identification of second trigger function name. In another embodiment, step b) includes the steps of: 1) receiving one or more availability factors, each availability factor providing information indicative of a current measurement scenario; 2) determining which the libraries contain trigger functions qualifying for a current measurement scenario; and 3) retrieving one or more trigger functions from qualifying trigger function libraries. In another embodiment, step d) includes the steps of: 1) receiving an operator selection of a described sequence level relative to which a desired trigger function is inserted; 2) select a desired trigger function from plurality of trigger functions displayed in trigger function name display region; and 3) incorporating selected trigger function in accordance with an operator insert instruction.

In another aspect of the invention, a method of creating a trigger function for use in a trigger development environment in a signal measurement system that acquires signal data in accordance with a trigger definition is disclosed. The method includes the steps of: a) creating a trigger definition having a plurality of trigger functions; b) receiving an operator selected two or more of the plurality of trigger functions; and c) including two or more trigger functions in a second trigger definition.

In a further aspect, a method of providing a trigger development environment in a signal measurement system is disclosed. The method includes the steps of: a) creating a display window having three regions; b) creating a list of trigger function names in a first of the three regions; c) creating a descriptor region having at least one descriptor visually-associated with a corresponding one of the list of trigger function names in a second of the three regions; and d) creating a trigger definition where a selected trigger name from the list of trigger names results in a display of a corresponding trigger function in a third of the three regions.

Various embodiments of the present invention provide certain advantages and overcome certain drawbacks of the conventional techniques. Not all embodiments of the invention share the same advantages and those that do may not share them under all circumstances. Further features and advantages of the present invention as well as the structure and operation of various embodiments of the present invention are described in detail below with reference to the accompanying drawings. In the drawings, like reference numerals indicate identical or functionally similar elements. Additionally, the left-most one or two digits of a reference numeral identifies the drawing in which the reference numeral first appears.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIG. 6A is a functional block diagram of one embodiment of a trigger development subsystem illustrated in FIG. 2.

FIG. 7 is a graphical user interface display of a trigger function library management dialog in accordance with one embodiment of the present invention.

DETAILED DESCRIPTION

The present invention is directed to signal measurement systems that acquire and store signal data in accordance with a trigger specification. The present invention is an integrated trigger function display system and methodology for trigger definition development in a signal measurement system having a graphical user interface. That is, the display regions are contemporaneously displayed and operatively coupled so as to coexist on the graphical user interface, with each region responsive to changes of, or actions taken in, any of the other regions. Specifically, the present invention contemporaneously displays one or more trigger function names each identifying a trigger function and, for one or more of the displayed trigger function names, an associated trigger function descriptor describing the corresponding trigger function. The system displays on the graphical user interface a trigger name display region that concurrently displays a plurality of trigger function names. A trigger descriptor display region, contemporaneously displayed with the trigger name display region, displays the one or more associated trigger function descriptors. The descriptor(s) and names are displayed so as to be visually-associated with each other by the operator.

In one aspect of the invention, an integrated and interactive trigger development system for trigger definition development in a signal measurement system having a graphical user interface is disclosed. The system displays a trigger development window having a trigger name display region, a trigger descriptor display region and a trigger definition display region having contemporaneously displayed therein a plurality of trigger function names, a trigger function descriptor associated with an identified trigger function name and one or more trigger functions associated with previously and currently-selected trigger names, respectively. An operator selects the relative positioning and interrelationship of the selected trigger functions to form a desired trigger definition for subsequent data acquisition. Embodiments of this aspect of the present invention provide for the graphical selection of the location of a selected trigger function within the trigger definition. The trigger functions may include data entry locations to enable the operator to specify trigger branch conditions and resulting actions.

Figure 1:
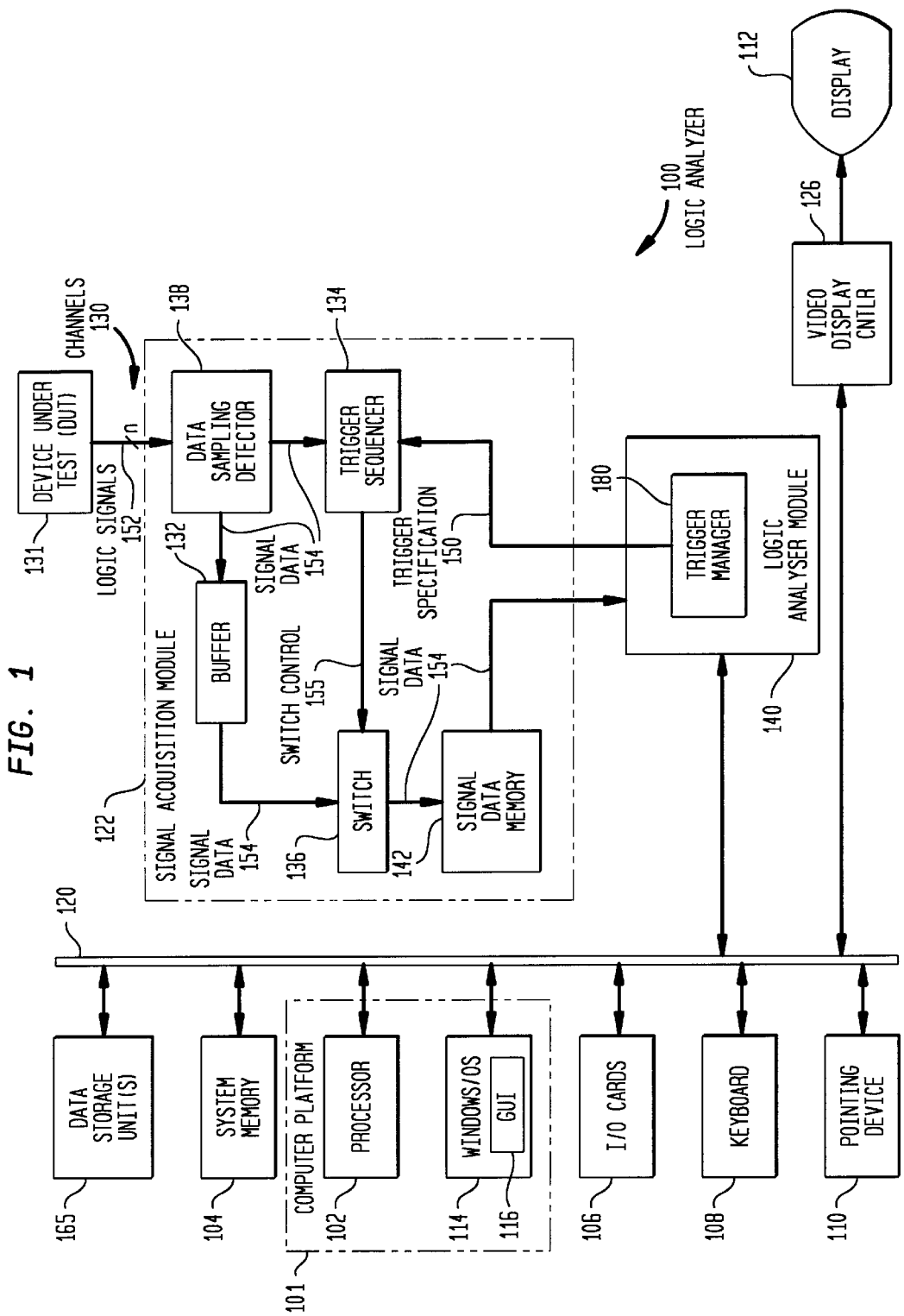
FIG. 1 is a block diagram of an exemplary logic analyzer in which the present invention can be implemented.

An exemplary signal measurement system environment in which aspects of the present invention will be described herein is a logic analyzer. FIG. 1 is a functional block diagram of such a logic analyzer. Logic analyzer 100 acquires, analyzes and displays a wide variety of signals generally in terms of the logic level of the signals versus time. In the illustrative embodiment, logic analyzer 100 includes a general purpose computer system, which is programmable using a high level computer programming language, and specially programmed, special purpose hardware for performing signal acquisition, analysis and display functions. It should become apparent from the following description that the present invention may be implemented in other environments such as a special purpose program operating on an on-board processors, ASICs, firmware, hardware, or a combination thereof.

Logic analyzer 100 includes processor 102, system memory 104, input/output (I/O) cards 106, storage units 165 such as a hard disk drive, floppy disk drive, etc. Analyzer 100 may also include one or more user input/output devices such as keyboard 108, pointing devices 110 and display 112. System memory 104 is used for storage of program instructions in addition to other computer-readable programs and data. In a preferred embodiment, system memory 104 includes random access memory (RAM). Display 112 is preferably a cathode ray display and is logically or physically divided into an array of picture elements (pixels). Input/output (I/O) interface cards 106 may be modem cards, network interface cards, sound cards, and the like.

Processor 102 is typically a commercially available processor, such as the PA-RISC processor from Hewlett-Packard Company, Pentium microprocessor from Intel Corporation, or PowerPC and 68000 series microprocessors from Motorola. Many other processors are also available. Such a processor executes a program referred to as an operating system 114, providing a graphical user interface (GUI) 116 and a windowing system, such as the various versions of the Windows operating systems from Microsoft Corporation, the NetWare operating system available from Novell, Inc., or the Unix operating system available from many vendors such as Sun Microsystems, Inc., Hewlett-Packard Company and AT&T. The operating system 114 controls the execution of other computer programs such as software embodiments of logic analysis module 140, and provides scheduling, input-output control, file and data management, memory management, and communication control and related services. Processor 102 and operating system 114, generally define a computer platform shown by dashed block 101, for which application programs in high level programming languages may be written. The functional elements of logic analyzer 100 communicate with each other via system bus 120.

Signal acquisition module 122 contains circuitry and software that samples and digitizes logic signals 152 from device under test 131. Signal acquisition module 122 receives logic signals 152 from device under test 131 via channels 130. Signal acquisition module 122 includes a data sampling detector 138 that receives and digitizes logic signals 152. Preferably, samples of logic signals 152 are obtained at regular time intervals. The time interval may be user-specified or synchronized with one of the logic signals 152 received from device under test 131, such a clock signal generated by DUT 131. Signal data 154 is a sampled and digitized representation of logic signals 152. The signal data acquisition module 122 also includes a buffer 132 that receives and temporarily stores signal data 154 from data sampling detector 138.

A trigger sequencer 134 selects the portion of signal data 154 for subsequent storage and display based on a operator-defined trigger specification 150. As noted, trigger specification 150 is specified generally by two parameters, a trigger definition that identifies the occurrences under which signal data is to be stored and a trigger position that identifies the relative position of the occurrence defined by the trigger definition. Trigger sequencer 134 stores in memory a predetermined quantity of signal data occurring before and after the specified occurrence. Trigger sequencer 134 provides switch control signal 152 to switch 136.

Trigger sequencer 134 also determines that trigger specification 150 has been achieved and provides a data collection termination 160 signal to logic analysis module 140 to indicate that display of sample logic signals 152 is to be performed. After the data collection termination signal 160 is generated, switch control signal 152 controls switch 138 to cease storing signal data 154 in signal data memory 142.

Logic analyzer 100 also includes a video display controller 126. Computer platform 101 drives video display controller 126 using standard windows applications program interfaces (API) and display data from logic analysis module 140 to the operator on display 112 under the control of video display controller 126.

Logic analysis module 140 includes a trigger manager 180 that provides the operator with the ability to create and modify trigger specifications for capturing desired signal and bus information occurring at channels 130. Trigger manager 180 also enables the operator to store such trigger specifications and to recall stored trigger definitions for subsequent use and modification.

Figure 2:
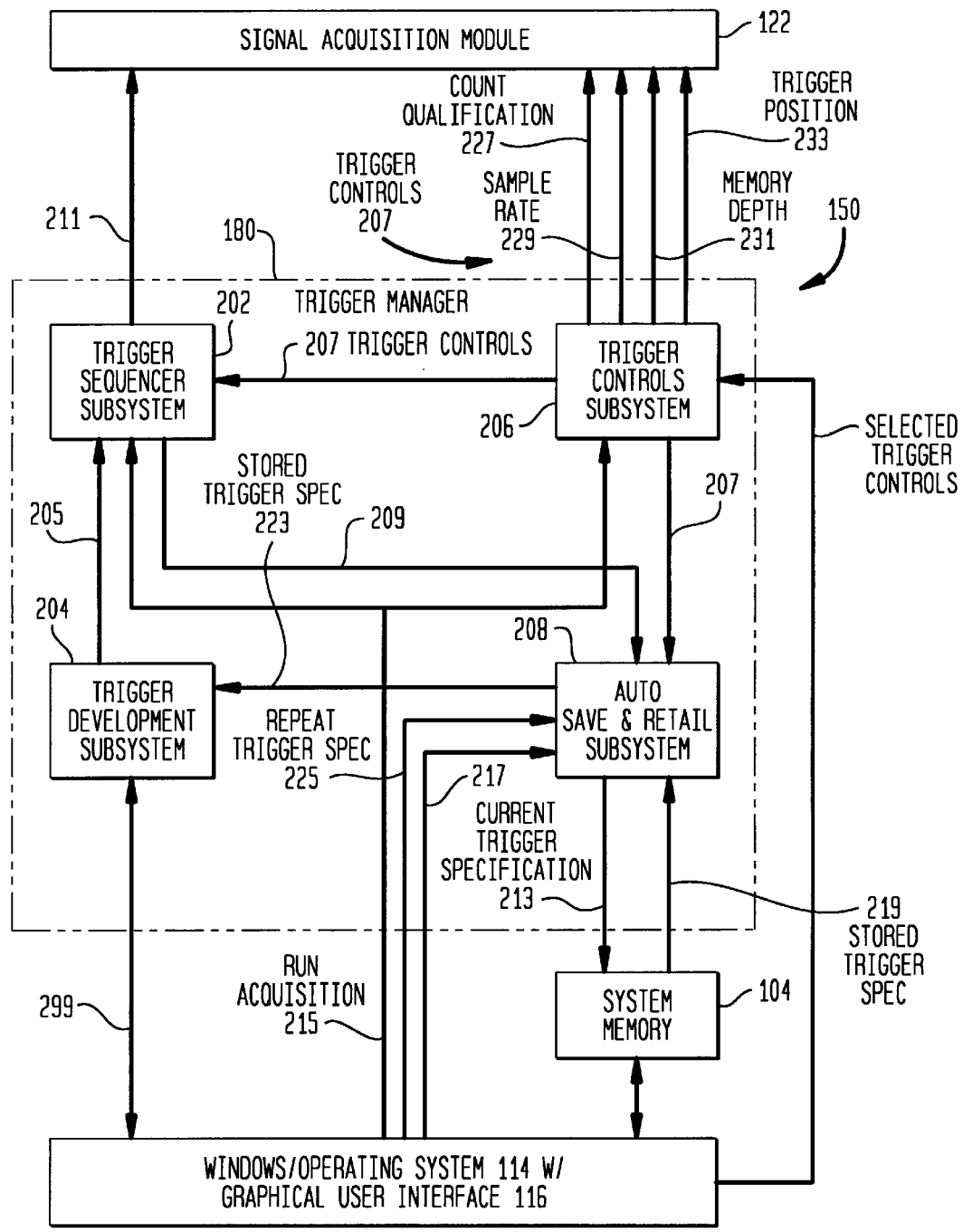
FIG. 2 is a functional block diagram of one embodiment of a trigger development system in which aspects of the present invention may be implemented.

FIG. 2 is a function block diagram of one embodiment of trigger manager 180. Trigger manager 180 is shown to primarily include 4 functional subsystems or components. Specifically, trigger manager 180 includes a trigger development subsystem 204 that provides the operator with an ability to develop trigger specifications. Trigger development subsystem 204 presents various displays on graphical user interface 116 to create an interactive and intuitive trigger development environment. Communications between trigger development subsystem 204 and GUI 116, represented generally by trigger specification display and control 299, will be described in detail below.

A trigger sequencer subsystem 202 receives trigger sequences 205 from trigger development subsystem 204 and translates trigger sequences 205. Trigger sequencer 202 generates trigger definition signals 211 suitable for controlling signal acquisition module 122.

Trigger controls subsystem 206 enables the operator to specify the characteristics of the captured data, and provides such trigger control parameters 207 to signal acquisition module 122. Trigger controls 207 include, for example, count qualification 227, sample rate 229, memory depth 231 and trigger position 233. These trigger controls are considered to be well known in the art.

Store and recall subsystem 208 enables the operator to store and recall trigger specifications for subsequent use and modification. Auto save and recall subsystem 208 stores a current trigger specification 213, including trigger definition 209 and trigger controls 207, upon the occurrence of a save trigger specification request 217. Store and recall subsystem 208 retrieves a stored trigger specification 219 stored in memory 104 in response to a recall trigger spec request 235, providing it to trigger development subsystem 202 as stored trigger spec 223.

To facilitate a clear understanding of the present invention, a few definitions are set forth below. A trigger definition is comprised of one or more "trigger primitives" translated by trigger sequencer subsystem 202 into a form suitable for controlling the signal acquisition module 122. Trigger primitives are generally of a common form recognized by those skilled in the art as an "if/then" statement, and may optionally include any predetermined number of trigger branches. Each trigger branch includes an "if" statement defining a branch condition and a "then" statement defining the activity to be performed following an affirmative completion of the branch condition ("action").

As will be described in detail below, trigger primitives forming a trigger definition may be displayed for editing by the operator. A trigger definition may alternatively be represented by a "trigger function(s)." A trigger function is a graphical representation of an one or more underlying trigger primitives. The graphical nature of the trigger function facilitates operator comprehension and editing of the underlying trigger primitive(s). These definitions will be further elucidated below with reference to FIGS. 3, 4 and 5.

Figure 3:
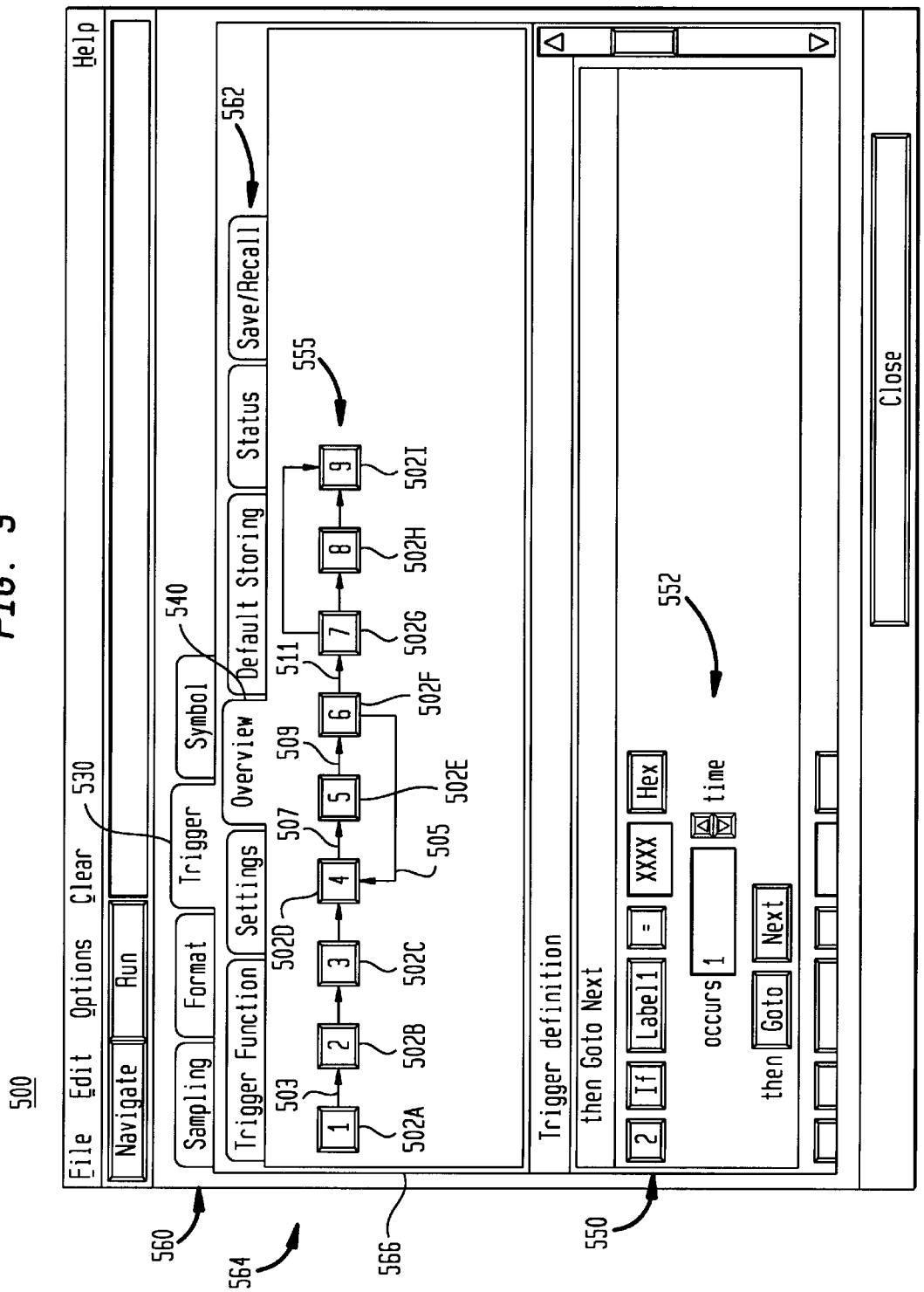
FIG. 3 is a graphical user interface display of an overview of a trigger definition in accordance with one embodiment of the present invention.

To facilitate understanding, the graphical user interface displays provided by embodiments of the present invention will be first described. FIG. 3 is a graphical user interface display of an overview of a trigger definition in accordance with one embodiment of the present invention.

As shown in FIG. 3, a display 500 provides tabbed windows, each associated with a main function of logic analyzer 100. In this illustrative embodiment, a primary tier 560 of tabs is shown at the top of display 500. Trigger-related operations are easily found under a "trigger" tab 530, the graphical selection of which causes the display of a second tier 562 of tabs, all of which are related to trigger development in logic analyzer 100.

Selection of a "overview" tab 540 in tier 604 causes the display of a trigger definition overview window 564. Window 564 is divided primarily into two regions: a trigger overview region 566 and a trigger definition region 550. Trigger definition region 550 provides the operator with an interactive environment in which to enter and edit a trigger definition 552, the overview 555 of which is displayed in region 566.

As noted, a trigger definition includes one or more trigger functions each corresponding to a sequence level. To facilitate viewing of a desired trigger definition, each trigger function of a trigger definition is displayed in the representative trigger definition overview as a graphical selection button. For example, the exemplary trigger definition 555 is composed of 9 trigger functions. In the associated trigger definition overview 555, they are represented by buttons 502A, 502B, 502C, 502D, 502E, 502F 502G, 502H and 502I, respectively (generally and collectively referred to as trigger function buttons 502).

Selection of a trigger function button causes the display of the appropriate portion of the trigger definition in the trigger definition region 550. An exemplary trigger function corresponding to the second trigger function button 502B is displayed in trigger definition display region 555.

Trigger definitions having multiple sequence levels are defined by the progression from one sequence level to the next in a manner indicated by arrows 503, 505, 507 and 509 in FIG. 3. Arrows 503, 505, 507 and 509 are indicative of actions contained within corresponding sequence levels 502, 508, 510 and 512. For example, completion of the condition defined by the trigger function of sequence level 1 502A results in execution of sequence level 2 502B as indicated by arrow 503. Such progress may be achieved by a "Goto Next" action. Similarly, fulfilment of the trigger function of sequence level 2 502B results in execution of sequence level 3 502C as indicated by arrow 506.

Sequence level 6 indicated by 502F is a graphical representation of a sequence level having multiple actions that control the progression through trigger definition 552. A Next action is indicated by arrow 511. Arrow 505 indicates progression through the trigger definition in a non-sequential manner such as may result from a "goto 4" action (For example, the trigger definition progresses from sequence level 6 512 to sequence level 4 508).

Although this example of a trigger definition overview is implemented using buttons 502, it should be understood that other trigger overview 555 and corresponding trigger definition 552 may be displayed using other graphical display techniques now or later developed such as menu items, icons and the like.

Figure 4:
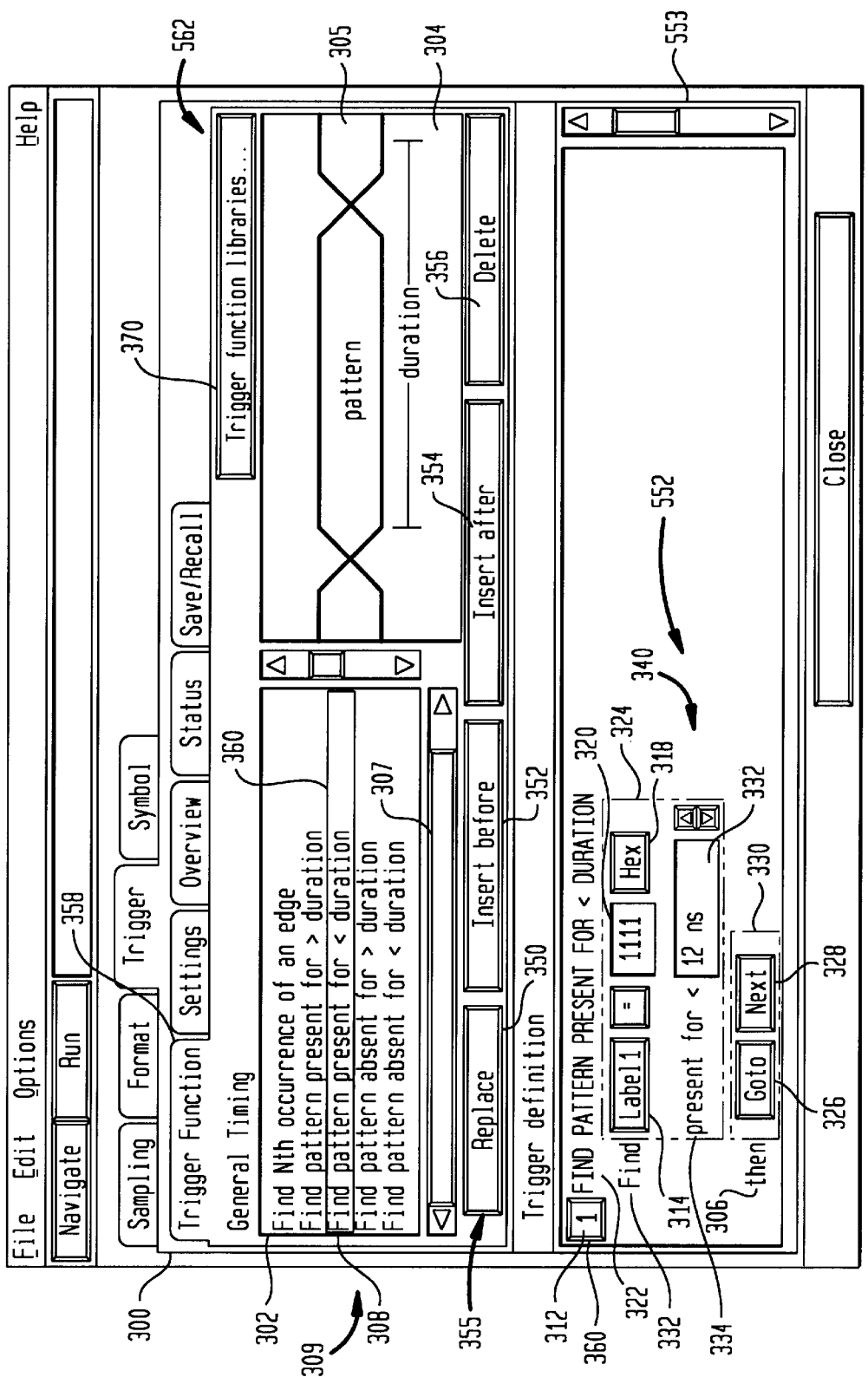
FIG. 4 is a graphical user interface display of an integrated trigger development window in accordance with one embodiment of the present invention.

In accordance with the exemplary embodiment described herein, graphical selection of "Trigger Functions" tab 358 in tier 562 results in the display of a display window referred to herein as trigger development window 300 providing information generated by trigger development subsystem 204 in accordance with aspects of the present invention. FIG. 4 is a graphical user interface display showing the contemporaneous display of one or more trigger function names and an associated trigger function descriptor for a selected trigger function name. In this illustrative embodiment, a trigger development window 300 is displayed. Window 300 includes a trigger name display region 302, a trigger descriptor display region 304 and a trigger definition display region 306 having contemporaneously displayed therein a plurality of trigger function names 309, a trigger function descriptor 305 associated with an identified trigger function name 308 and one or more trigger functions 340 associated with previously and currently selected trigger names, respectively.

As noted, trigger function names display region 302 provides a display of one or more trigger function names each corresponding to an available trigger function that may be incorporated into a trigger definition 552 displayed in trigger definition region 306. Many such trigger functions 340 may be available to the operator at any one given time. As such, trigger names display region 302 may provide a display of many trigger function names 309. In addition, the displayed trigger function names 309 may correspond to only a portion of available trigger functions. For example, in the embodiment illustrated in FIG. 4, five of perhaps 100 trigger function names are illustrated in trigger name display region 302. Scroll bar 303 is provided to enable the operator to advance forward and back in the available list, resulting in the display of a different 5 trigger function names. In certain embodiments, an additional scroll bar 307 may be provided to enable the operator to horizontally scroll across the 5 currently displayed trigger names to display portions of names that contain a number of characters greater than can be displayed in the trigger name display region 302.

Trigger function names 309 may be displayed in any representative form suitable for an operator to identify the corresponding trigger function. For example, besides the ASCII strings shown in FIG. 4, icons may be used. Further, although trigger name display region 302 is a scrollable list, trigger names 309 may be presented using any display technique capable of displaying multiple entries of a list and allowing for operator selections. Other trigger function display options include, for example, menus or option buttons.

As noted, one or more trigger function descriptors 305 each describing a corresponding trigger function 340 may be displayed in region 304 that is concurrently displayed and operatively coupled to trigger names display region 302. Displayed trigger descriptor 305 is visually associated with the identified trigger function name 308 in region 302. In a preferred embodiment, the single descriptor 305 displayed in region 304 is graphically or visually associated with the identified trigger name due to the operator highlighting of a trigger name 308. In the illustrative embodiment, a trigger name 308 is identified by graphically manipulating a highlight bar 360 to highlight a desired trigger name 308. The associated trigger descriptor 305 is then displayed in region 304.

Trigger function descriptor 305 describes a trigger function corresponding to trigger function name 308. In one embodiment, descriptor 305 is a bitmap illustrating a waveform annotated to illustrate the operation of the corresponding trigger function 340. Alternatively, a descriptor 305 may include other pictorial or textual descriptions of the identified trigger function. For example, descriptor 305 may include both pictorial and textual information. In an alternative embodiment, multiple trigger descriptors 305 are illustrated in trigger descriptor display region 304. In such embodiments, each displayed trigger function name 308 is visually associated with a displayed trigger descriptor 305. For example, color, font, position, size and other graphical characteristics may be utilized to achieve visual association of the contemporaneously displayed elements.

As noted, aspects of the present invention include a trigger definition region 306 in the integrated and interactive trigger development display window 300. Trigger definition region 306 displays one or more trigger functions associated with previously and currently selected trigger names 309 or descriptors 305. An operator can select the relative positioning and interrelationship of the selected trigger functions 340 to form a desired trigger definition 552 for subsequent data acquisition.

In operation, an operator may scroll through the list of trigger names 309 in trigger names display region 302 until the name of a desired trigger function 340 is displayed. To assist in such an identification, the corresponding trigger descriptor 305 displayed in region 304 may be simultaneously viewed. Once a desired trigger name 308 has been identified, it can then be selected by the operator by graphically selecting an edit button 355 described below. Such a selection results in the display of the corresponding trigger function 340 in the indicated location of trigger definition 552 displayed in trigger definition display region 306.

Trigger definition region 306 will now be described in greater detail with reference FIGS. 4 and 5. As noted, a trigger definition may include numerous trigger functions. To provide contemporaneous display of regions 302, 304 and 306, trigger definition region 306 will likely not completely display a current trigger definition 552. Accordingly, in the illustrative embodiment, region 306 includes a scroll bar 553 to enable an operator to navigate through a current trigger definition to display a portion of the definition to be edited.

Trigger definition 552 is comprised of one or more trigger sequence levels (as noted, trigger definitions are commonly referred to as trigger sequences). Each sequence level may include any number of trigger branches. A trigger definition is comprised of one or more trigger functions, each corresponding to a sequence level. To provide the operator with the ability to edit any sequence level of a current trigger definition, sequence buttons 312 are provided within region 306 to identify the sequence level of the displayed trigger function 340.

A trigger definition 552 is created and edited by selection of one or more trigger function names 309 in trigger name display region 302. Selection of a trigger name 308 is achieved using three of the four edit buttons: Insert Before button 352, Replace Button 350, and Insert After button 354. Such selection results in an identified trigger function 340 being added to a specified location of trigger definition 552. Operator selection of an edit button 350, 352 and 354 in combination with user selection of a sequence level 312 determines the location in which a selected trigger function will be added to the trigger definition 552. A selected sequence level 312 is indicated by highlighting of the selected button.

In the case that Insert Before button 352 is graphically selected, the sequence level number of trigger function 340 at the selected sequence level and all subsequent sequence levels are incremented by one and the trigger function corresponding to the identified trigger function 308 is entered at the selected sequence level. Similarly, in the case that Insert After button 354 is graphically selected, the trigger function corresponding to the identified trigger function 308 is entered at the sequence level one greater than the selected sequence level and all subsequent sequence levels are incremented by one.

In the case that the Replace Button 350 is graphically selected, the trigger function at selected sequence level 312 is deleted and the trigger function corresponding to the identified trigger function 308 is entered at the selected sequence level. Finally, in the case that the Delete Button 356 is graphically activated the trigger function at the selected sequence level 312 is removed and the trigger functions at subsequent sequence levels are decremented by one. Thus a graphically editable function representation of a trigger definition can be created.

Trigger definition region 302 is shown to display an exemplary trigger function "find pattern present for <duration." Trigger function 340 includes a combination of predefined text 332, 334 and 336 and operator-editable controls 314,316, 318,320,322. The combination of text and controls results in an easily understood description of a trigger definition.

Trigger function 340 includes a trigger condition 324 that requires bus Label 1 to maintain a bus value 1111 hexadecimal for 12 nanoseconds. Trigger condition 324 includes a bus/signal identification 314, an arithmetic operator 326 and data entry fields 320, 322. If trigger condition 324 is affirmative, action 330 is executed. Action 330 is comprised of an action operator 326 and action specification 328. The condition and actions shown are exemplary and may optionally be any branch condition or action known in the art.

While trigger condition 324 of trigger function 340 includes graphical user interface buttons 314, 336 and 318 and data entry fields 320 and 322, graphical user input of data may be achieved using any known method including dialog boxes or menus. Similarly, action 330, having buttons 326 and 328, may be specified using any known method of graphical user input.

Figure 5:
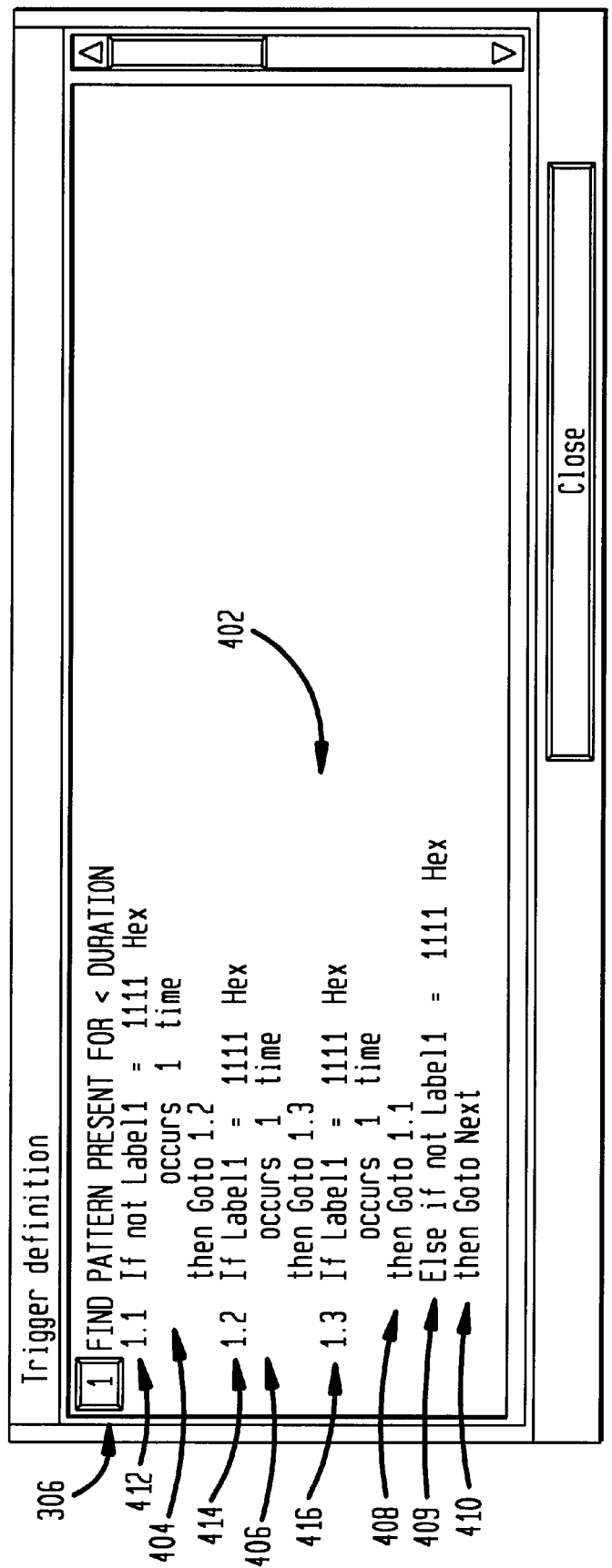
FIG. 5 is a graphical user interface display of an alternative representation of the trigger definition in the trigger definition region of the trigger development window of Figure.

FIG. 5 is a graphical user interface display of a trigger primitive representation of trigger definition 552 illustrated in FIG. 4. Trigger definition 402 is an alternative representation of "find pattern present for <duration." The trigger primitive representation of the trigger definition is displayed as a series of four branch conditions 404, 406, 408. Each branch condition is identified by branch condition identifiers 412, 414 and 416, respectively.

To determine whether bus value Label 1 is maintained at the specified bus value 1111 hexadecimal for a duration of 12 nanoseconds as entered by the operator into field 332 (FIG. 4), trigger primitive 402 sets forth 4 trigger branches for a given sampling rate of 4 nanoseconds. Each branch condition 404, 406, 408 and 409 corresponds to condition 324. As shown by the "goto" statements, all three branch conditions must be executed in the affirmative to perform the "Goto Next" action 410 which corresponds to action 330. Thus, primitive 402 requires that bus Label 1 maintain a bus value 1111 hexadecimal for three consecutive bus value samples.

The trigger function representation of the trigger definition presented above provides for a simple interactive method of altering the trigger primitives. FIGS. 4 and 5 illustrate the relative ease with which a trigger definition is created using trigger functions instead of programming language. Although the illustrated trigger primitive representation illustrated is not editable by the operator, to facilitate conversion to the trigger function representation 552, the trigger primitive representation of trigger definition 402 is operator editable in alternative embodiments of the present invention. By providing a display of one or more trigger functions associated with selected trigger names, trigger definition region 306 provides an easily edited graphical representation of a trigger definition.

FIG. 6A is a functional block diagram of one embodiment of a trigger development subsystem 204 of the present invention. A preferred implementation of subsystem 204 is in a commonly available computer-based signal measurement system having a graphical user interface and a pointing device such as logic analyzer 100. Trigger development subsystem 204 broadly includes a macro manager 602, a trigger function resource library 604, a library creator 670, and a trigger definition maintenance module 674. The subsystem 204 is preferably implemented in software code such as the object-oriented software C++ programming language, or the C structured programing language. Disclosed aspects of the present invention will be described with reference to an object-oriented implementation of a trigger development subsystem 204.

As noted, trigger development subsystem 204 provides the operator with an ability to 20 develop trigger specifications, presenting various displays on graphical user interface 116 to create an interactive and intuitive trigger development environment. Aspects of the trigger development subsystem 204 provide an interactive trigger definition region 306 on graphical user interface 116 in which the operator creates trigger definitions 552. Each trigger definition 552 is comprised of one or more trigger functions 340.

In accordance with one aspect of the present invention, the trigger functions are embodied in objects, referred to herein as trigger function objects 650. A trigger function object 650 contains a copy function method 663 to generate a corresponding trigger function 340 for display in trigger display window 300. Trigger function object 650 also includes one or more trigger primitives 664 which are represented by the corresponding trigger function 340. A trigger descriptor draw method 659 to draw a trigger descriptor 305 in trigger descriptor region 304 is included in trigger function object 650. Such predefined trigger function objects 650 are permanently stored in data storage unit 165 for importing into a resource library 604 of trigger development subsystem 204 for subsequent use in creating trigger specifications. Trigger function names 309 from trigger function objects 650 are presented on GUI 116 for operator selection of the corresponding trigger function during trigger definition development.

As will be become apparent from the following description, there are circumstances wherein numerous trigger function objects 650 are available. Each trigger function object 650 is used to form trigger definitions directed to one or more particular circumstances, such as a particular application of logic analyzer 100 or a particular test procedure to be performed by analyzer 100. As such, not all objects 650 need to be immediately available at any one given time. In one preferred embodiment, therefore, not all predefined trigger function objects 650 are loaded into resource library 604 for immediate use by the operator. Instead only a selected subset of trigger function objects 650 are loaded into resource library 604 from data storage unit 165. To facilitate this selection, trigger function objects 650 are preferably stored in individually selectable library objects 638; that is trigger function objects 650 stored in data storage unit 165 are categorized into individual library objects 638, each containing trigger function objects 638 which are appropriate for a given circumstance.

These libraries 638 are referred to as qualified libraries; that is qualified libraries are those libraries that contain trigger function objects 650 that are appropriate for use in a given circumstance. In the illustrative embodiment, such circumstances are identified by externally-generated availability factors 620. Availability factors 620 identify measurement scenarios for which different trigger functions are appropriate. Availability factors 620 may include, for example, an indication of the type of device under test, its manufacturer, model, etc., the type of measurements that are to be performed, operator identification, etc. In one preferred embodiment, availability factors 620 include the clock mode of logic analyzer 100. However, as one of ordinary skill in the relevant art would find apparent, any other factors may be entered by an operator to selectively load trigger function objects 650. The resulting trigger function objects 650 that are loaded into resource library 604 originate from qualified libraries 638. As will be discussed below, a macro manager 602 initiates loading of trigger function objects 650 into resource library 604.

Figures 6B, 6C:
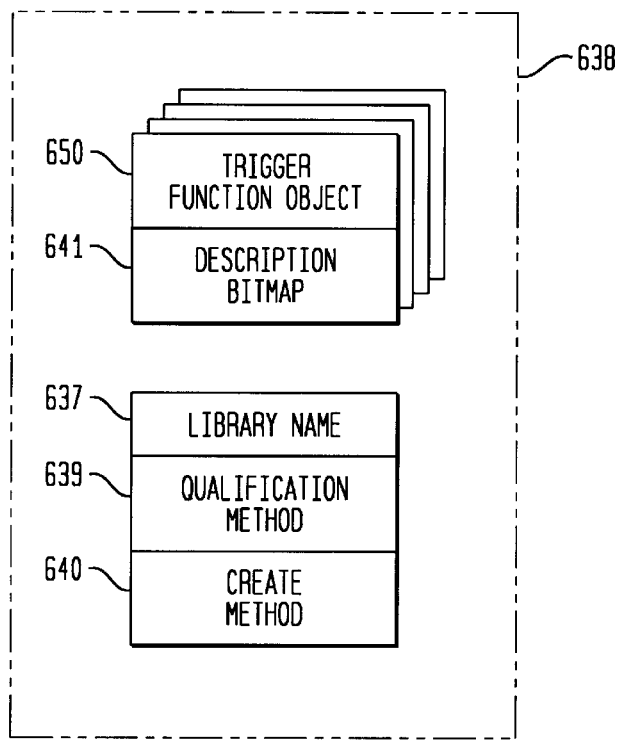
FIG. 6B is a schematic diagram of one embodiment of a trigger function library object utilized in embodiments of the present invention.
FIG. 6C is a schematic diagram of a one embodiment of a pointer array utilized in embodiments of the present invention.

An exemplary library object 638 is illustrated in FIG. 6B. Library object 638 includes library name 637 and one or more trigger function objects 650. Associated with each trigger function object 650 is a corresponding descriptor bit map 641 for rendering descriptor 305. A qualification method 639 in each library 638 determines whether trigger function objects 650 qualify to be loaded into resource library 604. Such a determination is based on a qualification call 634 generated by macro manager 602 which includes a representation of the circumstance defined by availability factors 620. Loading of trigger function objects 650 occurs in response to a load libraries signal 623 also generated by macro manager 602. In response to load libraries signal 623, library objects 638 create and transmit trigger function objects 650 to resource library 604. In the illustrative embodiment, a create method 640 is included in library objects 638 to copy trigger function objects 650 from library 638 to resource library 604.

Figure 6D:
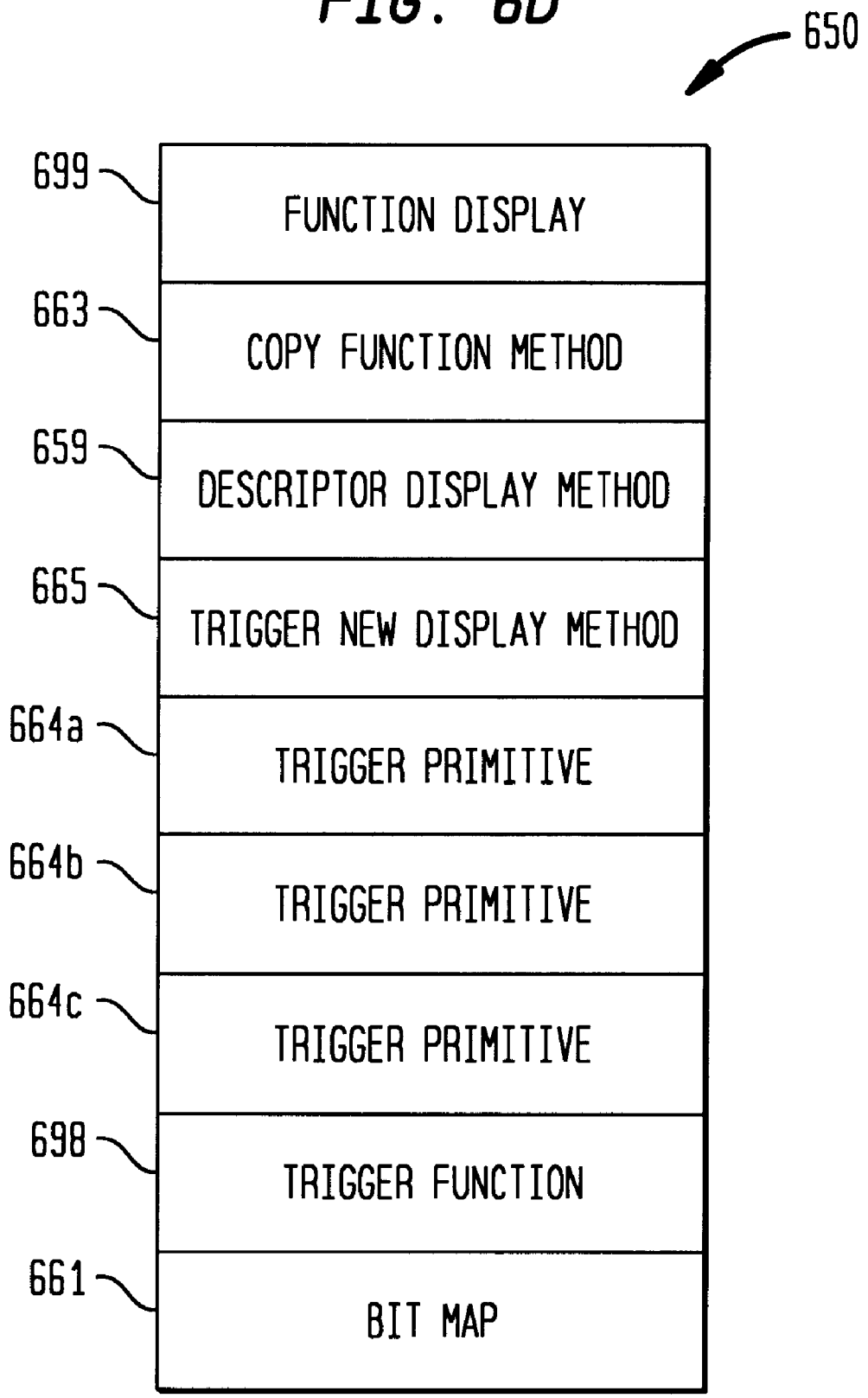
FIG. 6D is a schematic diagram of one embodiment of a trigger function object utilized in embodiments of the present invention.

An exemplary trigger function object 650 is illustrated in FIG. 6D. Trigger function object 650 includes a trigger name display method 665 for providing a trigger name identifying trigger function object 650 to graphical user interface 116. Such a trigger name is used to identify trigger function 698 in trigger name display region 302, and is used by an operator to graphically select the identified trigger function 698. When each trigger function object 650 is loaded into resource library 604, it executes a trigger name display method 665 which transmits a copy of trigger name 308 to GUI 116 for display.

Trigger function object 650 also includes a descriptor display method 659 for displaying a descriptor 305 descriptive of the trigger function 664 in descriptor region 304 of graphical user interface 116. This descriptor 305 is helpful to the operator to identify the operation of the trigger function whose name appears in trigger name display region 302. In a preferred embodiment, trigger function object 650 generates a descriptor 305 in descriptor display region 304 in response to operator-generated trigger function identification signal 653. In the illustrated embodiment, operator identification of a trigger function 698 is achieved by graphically identifying a trigger name 308. As shown in FIG. 4, in the illustrated embodiment, descriptor 305 is a bitmap of an annotated waveform to illustrate the operation of the corresponding trigger function 698. Alternatively, descriptor 305 may include other pictorial or textual descriptions of the identified trigger function.

Additionally, trigger function objects 650 contain a copy function method 663 for incorporation of trigger function 698, including function display 699, into the current trigger definition 552. Trigger function objects 650 provide the trigger function display 699 in trigger definition region 306 of GUI 116. The trigger function 698 is thereafter graphically editable by the operator during subsequent trigger definition development. A trigger function 698 is added to trigger definition 552 in response to a copy trigger function call 668 that is generated when an operator selects a trigger function name using edit buttons 355.

In the illustrative embodiment of the present invention, to enable quick access to trigger function objects 650 and the above-described methods, a pointer array 655 is maintained. A schematic representation of one embodiment of pointer array 655 is illustrated in FIG. 6C. Pointer array 655 contains, for each trigger function object 650 contained in resource library 604, a trigger function name 308, a library name 645 corresponding to a library object 638 that contains the trigger function, and a trigger function object pointer 659 corresponding to the memory location of trigger function object 650 stored in resource library 604. This data is received from qualified library objects 638 as shown in FIG. 6A.

In response to a pointer query 621, pointer array 655 provides a function object pointer 618, identifying the location of a trigger function object 650 within resource library 650. Pointer array 655 converts trigger name 308 identified by the operator into a memory pointer 659 to locate a trigger function object 650 contained in resource library 604. Access to a trigger function contained in resource library 650 enables execution of that trigger function object's methods; that is, trigger methods enable the generation of a trigger function 699 in trigger development window 300 and also enable a descriptor 305, corresponding to an operator-identified trigger function name 308, to be drawn in descriptor region 304.

Graphical user interface 116 determines when a selected trigger name 308 in trigger name area 302 has been selected, generating request object pointer 619 that is received by macro manager 302. Macro manager 602 accesses pointer array 655 using a name 308 identification received from GUI 116 as part of object pointer 619 and returns an address of the desired trigger function to GUI 116 for access to the appropriate trigger function object 650.

For example when an operator identifies a trigger function name 308, macro manager 602 obtains an operator-generated object pointer request 619 that includes operator-identified trigger name 308 from GUI 116. Pointer request 619 corresponds to an operator identified trigger name 308 in trigger name region 302. With trigger name 308, macro manager 602 accesses pointer array 655 to obtain a pointer 659 to a trigger functions object 650 corresponding to the selected trigger name 308. Macro manager 302 passes a pointer 618 to GUI 116 for use by GUI 116 in accessing draw descriptor method 659 of the appropriate trigger function object 650. Macro manager 602 provides the location of the selected trigger function object corresponding to selected trigger name 308, using a pointer query 621 to query the pointer array 655. Similarly when a trigger function is selected to be added to trigger definition 552 using edit buttons 355, GUI 116 generates an object pointer request 619 and macro manager 602 returns a pointer 618 to the trigger function object 650 for subsequent use in accessing a trigger function copy method 663.

As mentioned, macro manager 602 also initiates the loading of trigger function objects 650 from library objects 638. In one preferred embodiment, macro manager 602 generates a signal to begin the execution of a create method 640 in qualified library objects 638 to load trigger function objects 650 into resource library 604. This ultimately results in the display of trigger function names 308 in trigger function name region 302 of GUI 116.

In a preferred embodiment, macro manager 602 generates a qualification signal 634 that is used for qualification of library objects 638 based on availability factors 620. In the illustrated embodiment, availability factors 620 are received by macro manager 602 from GUI 116 and are combined to form an availability code or string indicative of circumstance identified by the availability factors 620. Although availability factors 620 are shown as originating from GUI 116, it is understood that the availability factors 620 may alternatively be system generated using any signal created by logic analyzer 100.

A trigger definition maintenance module 674 maintains copies of selected trigger function objects 650 that form a current trigger definition 552 and converts the selected trigger functions 340 to their trigger primitive form for subsequent translation to a form suitable for signal acquisition module 122. Trigger definition maintenance module 674 also allows for the interactive creation of a trigger definition by the operator.

The relative location of trigger functions within a created trigger definition must be maintained and the current trigger definition must be presented for display on GUI 116 in a fashion that allows for subsequent modification by an operator. Thus, trigger definition maintenance module 674 maintains the state of the current trigger definition by storing copies of trigger function objects 650 received from resource library 604 in an order indicative of the current trigger definition 552.

Trigger definition module 674 selectively adds and deletes trigger definition objects 685 in response to operator inputs at GUI 116. Trigger definition module 674 maintains a pointer to operator-selected trigger definition sequence levels 312 with each copied trigger function object to determine the sequence level at which trigger functions should be added or deleted, thereby ensuring proper relative positioning of the selected trigger function objects 650 in trigger definition module 674.

When an operator uses GUI 116 to insert or replace a trigger function 340 within trigger definition 552, trigger definition module 674 receives an insert/replace signal 686 from GUI 116. Included in insert/replace signal 686 is a function object pointer 618, from macro manager 602, to a selected trigger function object 650 corresponding to selected function 308. The selected function 650 is added to trigger definition 550, based on the location identified by pointer, in response to call add function signal 668. The exact location that the trigger function is entered in a trigger definition is determined by a pointer to a user-selected sequence level and edit button 355 Trigger function definition module 609 generates a call add function signal 668 and receives a copy of trigger function 666 from the selected trigger function 308.

After a trigger function is added to trigger definition module 609 trigger definition display 680 is sent to update the display of the trigger definition contained in trigger definition region 306 of GUI 116. Any subsequent operator modifications to the trigger definition 340 using GUI 116 results in a trigger modification signal 625 being transmitted to the trigger definition module 609. Thus the trigger function definition module 650 maintains an updated trigger definition.

Trigger definition maintenance module 674 forwards trigger primitives corresponding to the current trigger definition 552 when, for example, the operator invokes acquisition of signal data. Trigger definition module 674 transfers, in the appropriate sequence, trigger primitives 698 to trigger subsystem 202 for the logic analyzer to collect signal data.

In the course of creating a trigger definition 552, the operator may realize that a combination of trigger functions (i.e., trigger sequence levels) may be needed for inclusion in subsequently-created trigger definitions. In a preferred embodiment, a function creator 670 is used to create an operator-defined trigger function object 650 corresponding to operator selected trigger sequences. The operator-created trigger function can subsequently be selected for inclusion in a trigger definition 552.

Trigger function libraries button 370 is used to initiate creation of an operator-defined trigger function. As a result of graphical selection of button 370, creator 670 receives create function signal 673 from GUI 116. Create function signal 673 includes an identification of the library object 638 into which a created trigger function file 671 is to be stored. Additionally, create function 673 includes an operator-selected trigger function name 308 to be included in trigger name region 302 for future operator selection. In response to the create function signal 673, function creator 670 generates a sequence level query 675. Function creator 670 creates a trigger function object 650 corresponding to operator-identified sequence levels. A trigger function file 671 corresponding to the created trigger function is produced in the appropriate library object 638. Library object 638 updates pointer array 655 to include the created function.

The following is a description one embodiment of GUI 116. As noted with reference to FIGS. 3–5, graphical user interface 116 displays a trigger development window 300 having a trigger name display region 302, a trigger descriptor region 304 and a trigger definition region 306 having contemporaneously displayed therein a plurality of trigger function names 309, a trigger function descriptor 305 visually-associated with an identified trigger function name 308 and one or more trigger functions 340 associated with selected trigger names, respectively.

As shown in FIG. 6A, graphical user interface 116 receives inputs from the operator to create a current trigger definition 552 using the trigger definition development display region 300. Selection of a trigger name 309 results in a trigger function object pointer request 619 transmitted to macro manager 602 to identify the currently selected trigger name 309. This results in GUI 116 receiving a pointer 618 to trigger function object 650, as noted above.

For example when an operator graphically identifies a trigger name 308, GUI 116 requests an object pointer to the selected trigger function object 650. GUI 116 uses the function object pointer 618 to generate calls to methods of the trigger function object 650, such as draw descriptor 659. When graphically selecting the location of a created trigger function within the trigger definition 552 using, the insert after and insert before button 354, 352, GUI 116 requests and receives a function object pointer 618 to the selected trigger function object 650. GUI 116 transmits an insert/replace signal 686, including function object pointer 618, to trigger definition module 674.

To display a trigger function representation of a trigger definition in trigger definition region 306, GUI 116 receives trigger definition display 680. The trigger definition display includes trigger functions 340 to allow for easy editing of trigger definition 550 using GUI 116. Subsequent operator editing of trigger function 340 using GUI 116 results in trigger definition display signal 680 being transmitted to trigger definition function module 651.

Graphical user interface displays associated with the operator creation of trigger functions are described below with reference to FIGS. 7–9. FIG. 7 is a graphical user interface display of a trigger function library management dialog 700. Trigger function library management dialog 700 results from selection of trigger function libraries button 370 (FIG. 4).

In resource library 604, trigger function objects 650 are maintained in library objects 638 as in the data storage unit 165. Dialog 700 has a list of qualified libraries displayed in qualified library name region 720 and a description of a identified library name in list 702 in library description region 722. An operator may selectively add or delete from trigger name region 302 trigger names 309 associated with a library object 638 by identifying the library name 706 and selecting a load button 707 or unload button 708. The trigger names 309 in the library corresponding to a selected library name 706 are then added or deleted, respectively. Edit button 712 allows an operator to modify the contents of a qualified library; library editing is discussed below. Delete button 716 can be used to remove trigger function objects 650 corresponding to a library 706 from resource library 604 An operator can initiate creation of trigger functions using create button 710; trigger function creation is discussed in detail below.

Figure 8:
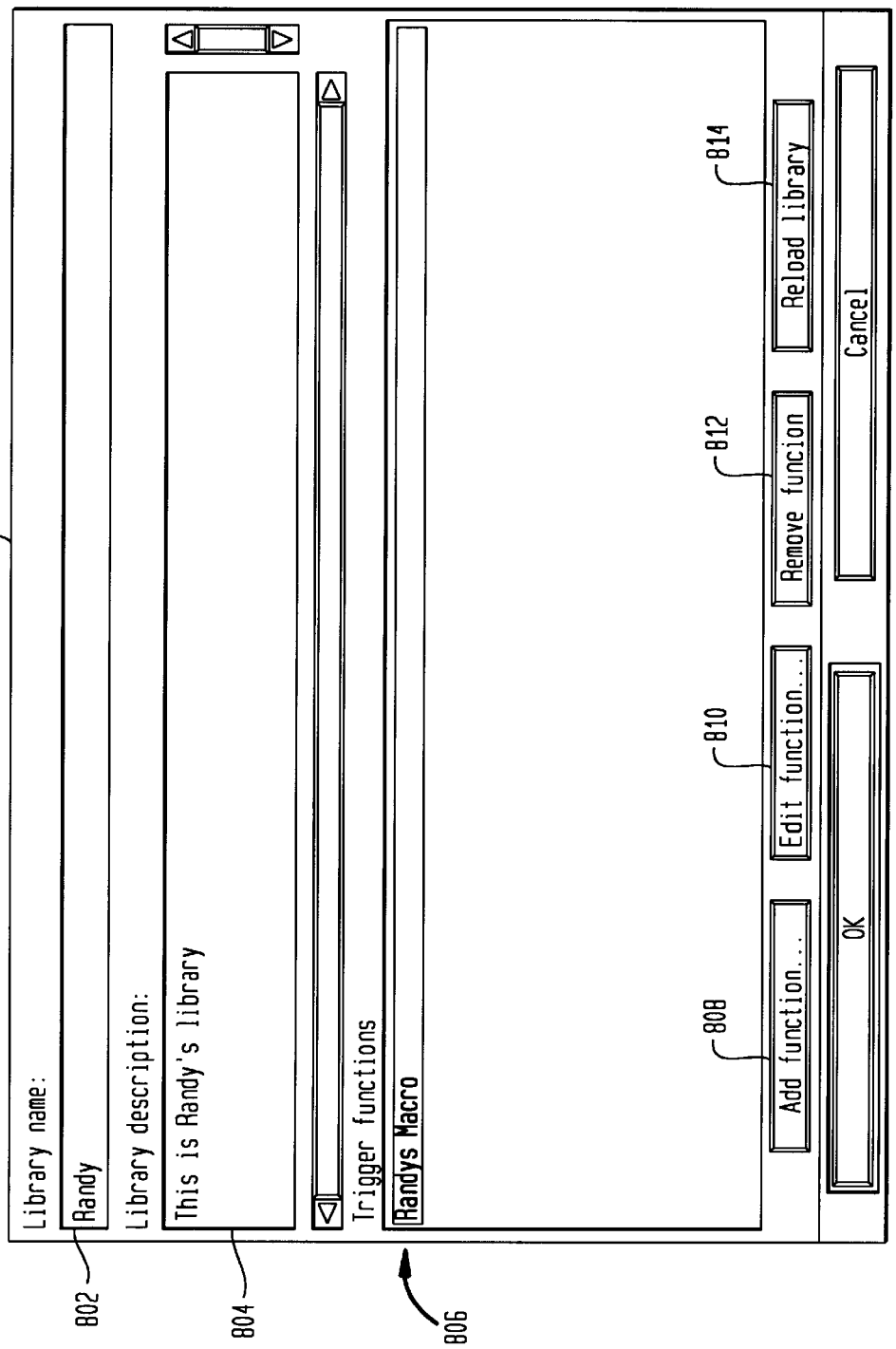
FIG. 8 is a graphical user interface display of a library edit dialog in accordance with one embodiment of the present invention.

FIG. 8 is a graphical user interface display of a library edit dialog 800. Selection of edit button 712 on dialog 700 results in the display of window 800. Text entry fields 802 and 804 allow an operator to modify library names and library description, respectively. Modification of a library name using text field 802 results in a change of a corresponding trigger library name 702 in trigger function library management dialog 700. A list of trigger function names 806 corresponds to trigger functions contained in the library identified by library name. Edit function 810 allows an operator to edit an existing operator-defined trigger function. Remove trigger function 812 allows an operator to remove a trigger function from a library and thereby selectively remove the function from trigger name display region 302. Reload library button 814 allows an operator to initiate load libraries signal 623 and begin the load the process discussed above with reference to FIG. 6. Selection of add function button 808 allows an operator to create a function.

Figure 9:
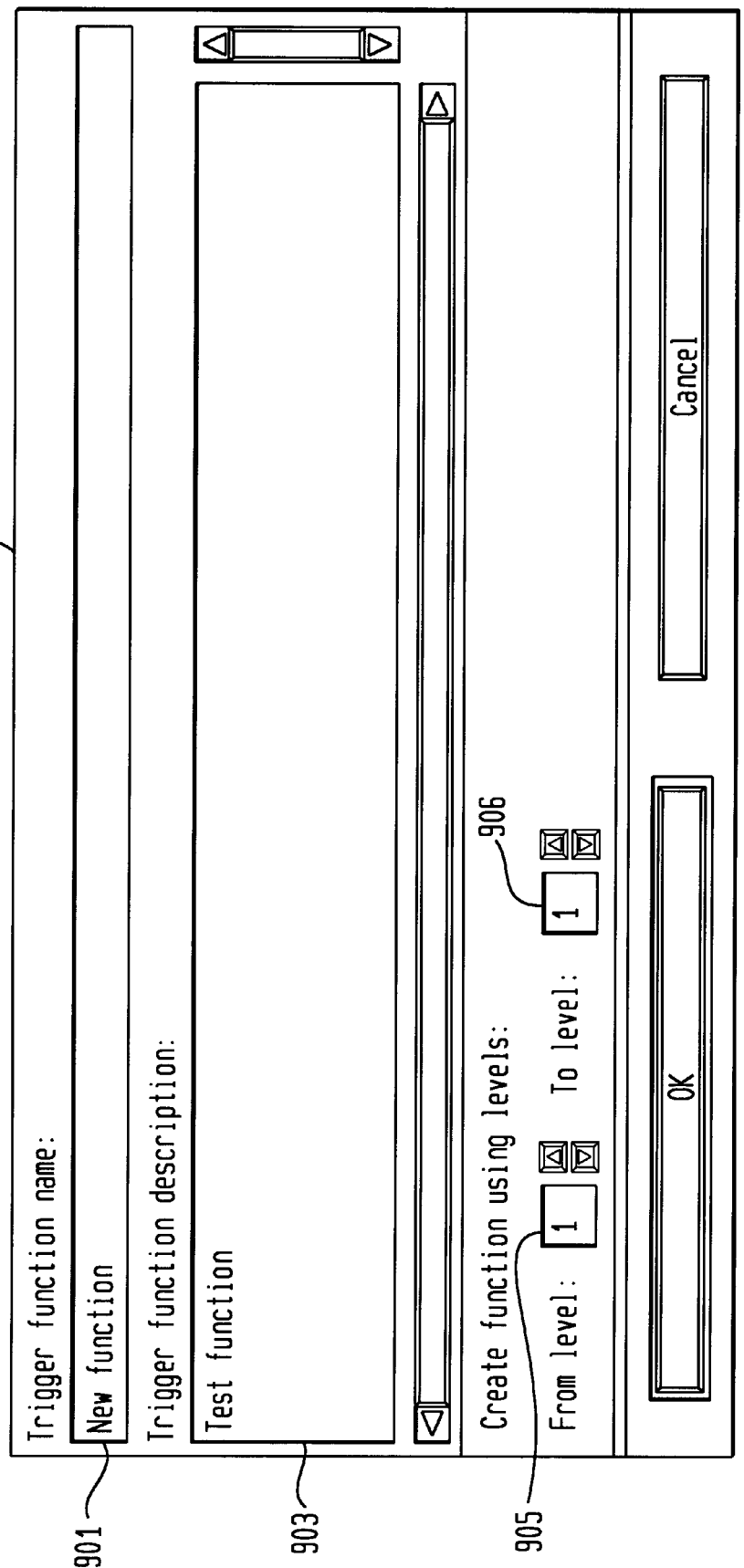
FIG. 9 is a graphical user interface display of a trigger function creation dialog in accordance with one embodiment of the present invention.

FIG. 9 is a graphical user interface display of a trigger creation dialog. Trigger creation dialog includes a trigger function creation display window 900 that results from operator selection of add function button 808 on window 800. An operator can select a trigger name for a created function using text entry field 901. Text field 903 allows the user to enter a textual description of a created trigger function. The textual description is a descriptor region 304 as described above. It is understood that although descriptor entry is displayed as a text entry field alternative embodiments may be implemented in a to allow an operator to enter bitmap, icon, waveform or other description to described a created trigger function.

An operator may add a trigger function, and thereby display a corresponding trigger function name 308 in trigger name region 302. Adding a trigger function results in the addition of a trigger function objects 650 to resource library 604 and in a preferred embodiment also results in a trigger function being added to a selected library object 638 for subsequent use in trigger definition development. To add a function an operator uses text entry fields 905 and 906 to select trigger sequence levels 312 to be included in an operator-created trigger function. The added trigger function corresponds to sequence levels 312 of the trigger definition in trigger definition region 306. Although text entry fields are depicted for sequence level entry, other methods identifying trigger function to be included in a created trigger function.

Figure 10:
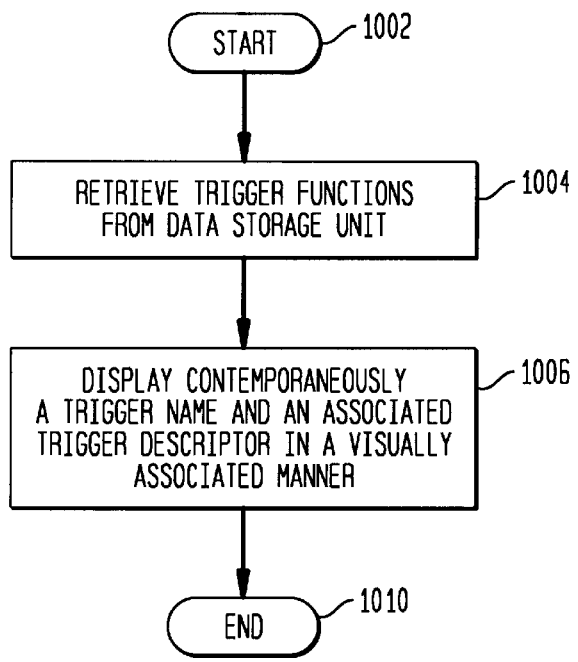
FIG. 10 is a high level flow chart of processes performed to provide a trigger development environment in accordance with certain aspects of the present invention.

FIG. 10 is a high level flow chart of processes performed to provide a trigger development environment in accordance with certain aspects of the present invention. After start block 1002, processing continues at block 1004 at which trigger functions are retrieved from data storage unit 165.

At block 1006, a trigger names region and a trigger descriptor region are contemporaneously displayed on graphical user interface 116 and are operatively coupled to each other. Trigger names region 302 has a plurality of trigger function names 309 displayed therein while trigger descriptor region 304 has a first trigger function descriptor 305 displayed therein such that the trigger function descriptor 305 is visually associated with an identified one 308 of the plurality of trigger function names 309. Preferably, a trigger definition region 306 having a trigger function 340 corresponding to a graphical selection of one of plurality of trigger function names 309 is displayed contemporaneously with the trigger names and trigger descriptor display regions 302, 304. In alternative embodiments, a second trigger function descriptor is displayed in the trigger descriptor region 304 so as to be visually associated with a second of plurality of trigger function names in response to an operator identification of an associated second trigger function name. Processing ceases at block 1010.

Figure 11:
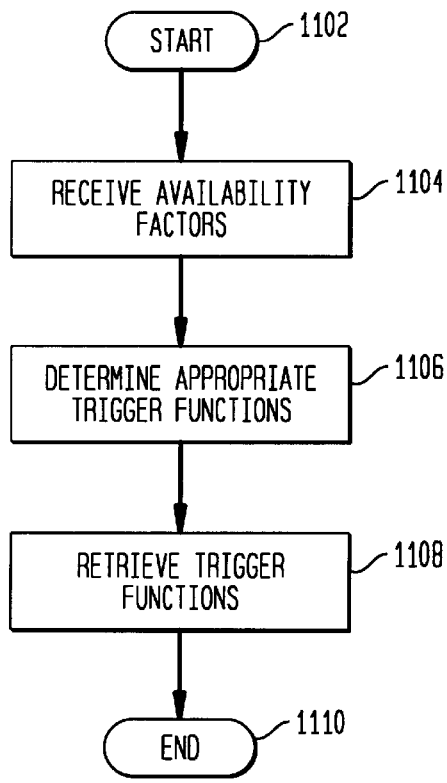
FIG. 11 is a flow chart of processes performed in accordance with one embodiment of the present invention to retrieve trigger functions from the data storage unit.

FIG. 11 is a flow chart of processes performed in accordance with one embodiment of the present invention to retrieve trigger functions from the data storage unit 165. As noted, in certain embodiments, trigger functions are categorized into library objects on the data storage unit 165. Each of these libraries contain trigger functions appropriate for use in a given measurement scenario is made. After start block 1102 one or more availability factors are received at block 1104. As noted, each of the availability factor provides information indicative of a current measurement scenario. At block 1106, a determination as to which of the libraries contain trigger functions appropriate for the current measurement scenario. Finally, at block 1108 one or more trigger functions are retrieved.

Figure 12:
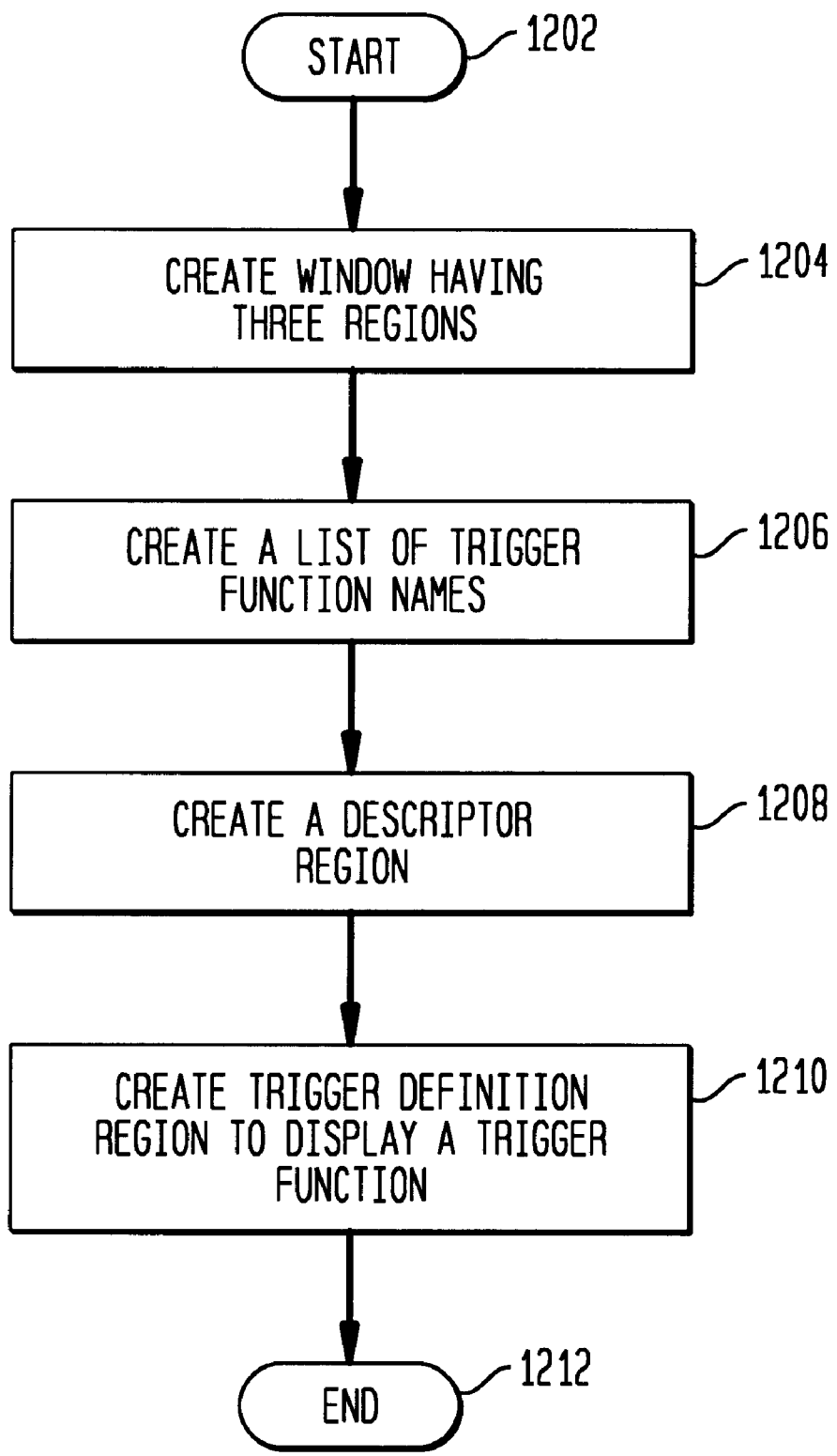
FIG. 12 is a flow chart of the steps performed by one embodiment of the present invention to provide a trigger development environment in a signal measurement system.

FIG. 12 is a flow chart of the steps performed by one embodiment of the present invention to provide a trigger development environment in a signal measurement system. After start block 1202, processing continues at block 1204 at which a display window having three regions is created on graphical user interface 116. At block 1206, a list of trigger function names is created in a first of three regions. Then, at block 1208, a descriptor region is created. The descriptor region has at least one descriptor visually-associated with a corresponding one of the list of trigger function names in a second of three regions. A trigger definition is created at block 1210 where a selected trigger name from the list of trigger names results in a display of a corresponding trigger function in a third of the three regions.

While various embodiments of the present invention have been described above, it should be understood that they have been presented by way of example only, and not limitation. For example, exemplary aspects of the present invention have been described in relation to a logic analyzer. It should be apparent to those of ordinary skill in the art that the present invention may be implemented in any signal measurement system that acquires signal data in accordance with a trigger specification. For example, the present invention may be implemented in a digital oscilloscope, protocol analyzer, microprocessor emulator, bit error rate tester, network analyzer, etc. Although reference has been made to a sequence of graphical user interfaces to achieve a result, it is understood that additional or alternative sequence steps may be included to achieve the same or similar result.

Additionally, although the illustrated embodiment has been described using a particular object oriented implementation, it is understood that this is by way of example only. The same or similar functionality may be implemented using other object oriented arrangements as well as structured programing languages, firmware or hardware. Thus, the breadth and the scope of the present invention are not limited by any of the above exemplary embodiments, but are defined only in accordance with the following claims and their equivalents.

What is claimed is:

1. An integrated trigger function display system for trigger definition development in a signal measurement system having a graphical user interface, the trigger function display system constructed and arranged to contemporaneously display in a visually-associated manner a trigger function name and an associated trigger function descriptor describing a trigger function identified by said associated trigger function name, wherein said trigger function name is displayed in a trigger name region of a display window that concurrently displays a plurality of trigger function names corresponding to a plurality of trigger functions and wherein said descriptor is displayed in a trigger descriptor region of said display window, wherein each trigger function is a graphical representation of one or more trigger primitives where said trigger primitives arc constructed to be translated to a form suitable to control the signal measurement system, and wherein said trigger primitives define one or more trigger branches used to form a sequence level of the trigger definition.

2. The system of claim 1, wherein for a selected trigger function name, one of said plurality of selected trigger functions or one or more underlying trigger primitives comprising said selected trigger functions is displayed in a trigger definition region of said display window for editing by the operator.

3. The system of claim 1, wherein said plurality of trigger function names are displayed while a single descriptor is displayed for an identified trigger function.

4. The system of claim 1, wherein said plurality of trigger names and a plurality of descriptors are displayed and a first trigger name and a first descriptor are visually associated.

5. The system of claim 1, wherein said integrated trigger function display system comprises:
   a trigger function resource library including,
      a plurality of predefined trigger function objects, each including, a trigger function name, one or more trigger primitives, and a corresponding trigger function display for representing said one or more trigger primitives on the graphical user interface, and
      a trigger function descriptor associated with said trigger function object; and
   a trigger definition maintenance module constructed and arranged to maintain copies of selected trigger function objects that form a current trigger definition and to convert said selected trigger functions to a trigger primitive form for subsequent translation to a form suitable for signal measurement system.

6. The system of claim 5, wherein said trigger function object further comprises:
   a copy module constructed and arranged to generate a corresponding trigger function for display in said display window; and
   a trigger descriptor draw module constructed and arranged to draw a trigger descriptor in said trigger descriptor region.

7. The system of claim 5, wherein said integrated trigger function display system further comprises:
   a macro manager for creating said trigger function resource library of trigger functions.

8. The system of claim 7, wherein said macro manager is configured to qualify trigger functions to determine which of said trigger functions qualify and to generate a trigger function library that includes said qualified trigger functions.

9. The system of claim 8, wherein said macro manager qualifies said available trigger functions based on qualification factor characteristics indicative of a given circumstance.

10. The system of claim 8, wherein said macro manager creates and maintains a pointer array with names and pointers to said trigger functions.

11. The system of claim 10, wherein said predefined trigger function objects are permanently stored in a data storage unit coupled to said system, and wherein qualified ones of said trigger function objects are stored in a resource library for subsequent use in creating trigger definition.

12. The system of claim 8, wherein said qualified trigger function objects are those that are appropriate for use in a given application of the signal measurement system, said given application identified by one or more availability factors.

13. A trigger development system for trigger definition development in a signal measurement system having a graphical user interface, the trigger function development system constructed and arranged to contemporaneously display in a visually associated manner, said display window including a trigger function name in a trigger name display region, an associated trigger function descriptor describing a trigger function identified by said associated trigger function name in a descriptor display region, and said trigger function is displayed in a trigger definition region of said display window for editing wherein said function is generated in said trigger definition display window in response to an input from said graphical user interface,
   wherein each trigger function is a graphical representation of one or more trigger primitives where said trigger primitives are constructed to be translated to a form suitable to control the signal measurement system, and wherein said trigger primitives define one or more trigger branches used to form a sequence level of the trigger definition.

14. The trigger development system of claim 13, wherein said trigger name display region and said trigger descriptor display region are located adjacent to each other on the graphical user interface.

15. The trigger development system of claim 13, further comprising a trigger definition maintenance module to receive inputs from said graphical user interface and maintain a trigger function representation of a trigger definition.

16. The trigger development system of claim 15, wherein the trigger function includes multiple sequence levels.

17. The trigger development system of claim 16, wherein an operator can add trigger function at any location relative to one of said multiple sequence levels.

18. The trigger development system of claim 15, wherein said added trigger function corresponds to said trigger function descriptor.

19. The trigger development system of claim 13, wherein said visual association is achieved by highlighting only one trigger name.

20. The trigger development system of claim 13, wherein said descriptor includes a pictorial describing said trigger function.

21. The trigger development system of claim 13, wherein said descriptor is an annotated waveform description of said trigger function.

22. The trigger development system of claim 13, wherein said trigger function is one of a plurality of trigger functions, and wherein said trigger function was selected based on a current application of the signal measurement system.

23. The trigger development system of claim 19, wherein said current application of the signal measurement system is defined by one or more availability factors.

24. The trigger development system of claim 20, wherein said one or more availability factors comprises a type of device under test.

25. The trigger development system of claim 13, further comprising a plurality of trigger function libraries each said trigger function library comprising:
   a plurality of trigger functions, wherein said trigger function is included in one of said libraries.

26. A trigger display system for trigger definition development in a signal measurement system having a graphical user interface that includes a trigger name region having names corresponding to selectable trigger functions and a first trigger definition region including a first trigger definition comprising a plurality of selected trigger functions displayed in corresponding sequence levels, one or more of said sequence levels designated to comprise a user created trigger function wherein said user-created trigger function is configured to be a selectable trigger function and wherein selection of said user-created trigger function results in inclusion of said one or more sequence levels in a second trigger definition,
   wherein each trigger function is a graphical representation of one or more trigger primitives where said trigger primitives are constructed to be translated to a form suitable to control the signal measurement system.

27. A method of providing a trigger development environment in a signal measurement system that acquires signal data in accordance with a trigger definition, the signal measurement system having a graphical user interface and a data storage unit, the method comprising the step of:
   a) displaying contemporaneously on the graphical user interface a trigger names display region having a plurality of trigger function names displayed therein, each said trigger names identifying an associated trigger function, and a trigger descriptor region operatively coupled to said trigger name display region and having a first trigger function descriptor displayed therein, wherein said trigger function descriptor is visually associated with an identified one of said plurality of trigger function names displayed within said trigger names display region
   wherein each trigger function is a graphical representation of one or more trigger primitives, said trigger primitives being constructed to be translated to a form suitable to control the signal measurement system, and wherein said trigger primitives define one or more trigger branches used to form a sequence level of the trigger definition.

28. The method of claim 27, further comprising the step of:
   b) retrieving, prior to said step a), from the data storage unit,
   trigger functions,
   one or more primitives forming said trigger function,
   trigger function names, and
   trigger function descriptors;
   c) displaying a trigger definition region contemporaneously with said trigger name display region and said trigger function descriptor display region; and d) displaying at a specified location within said trigger definition display region a trigger function corresponding to graphically selected one of said plurality of trigger function names displayed in said trigger function name display region.

29. The method of claim 27, wherein said step a) comprises the step of:
1) displaying in said trigger descriptor region a second trigger function descriptor visually associated with a second of said plurality of trigger function names in response to a user identification of said second trigger function name.

30. The method of claim 28, wherein said trigger functions are categorized into libraries on the data storage unit, each said library containing trigger functions appropriate for use in a given measurement scenario, wherein said step b) comprises the steps of:
1) receiving one or more availability factors, each said availability factor providing information indicative of a current measurement scenario;
2) determining which of said libraries qualify so as to contain trigger functions appropriate for said current measurement scenario; and
3) retrieving one or more trigger functions from said qualifying trigger function libraries.

31. The method of claim 28, wherein said step a) comprises the steps of:
1) forwarding said plurality of trigger function names to the graphical user interface;
2) displaying in said trigger name display region said plurality of trigger function names;
3) determining an identified trigger name of said displayed plurality of trigger function names; and
4) displaying said first descriptor associated with said identified trigger function name in said trigger function descriptor display region.

32. The method of claim 28, wherein said step d) comprises the steps of:
1) receiving an operator selection of a desired sequence level relative to which a desired trigger function is inserted;
2) select a desired trigger function from said plurality of trigger functions displayed in trigger function name display region; and
3) incorporating said desired trigger function at an in accordance with an operator insert instruction.

33. A method of creating a trigger function for use in a trigger development environment in a signal measurement system having a graphical user interface and a data storage unit, and that acquires signal data in accordance with a trigger definition, wherein said trigger function is a graphical representation of one or more trigger primitives each constructed to be translated to a form suitable to control the signal measurement systems and which define one or more trigger branches used to form a sequence level of the trigger definition, the method comprising the steps of:
a) creating a trigger definition having a plurality of trigger functions;
b) receiving an operator selected two or more of said plurality trigger functions; and
c) including said two or more trigger functions in a second trigger definition.

34. A method of providing a trigger development environment in a signal measurement system, comprising the steps of:
a) creating a display window having three regions;
b) creating a list of trigger function names in a first of said three regions;
c) creating a descriptor region having at least one descriptor visually-associated with a corresponding one of the list of trigger function names in a second of said three regions; and
d) creating a trigger definition where a selected trigger name from the list of trigger names results in a display of a corresponding trigger function in a third of said three regions, each trigger function being a representation of one or more trigger primitives translatable to a form suitable to control the signal measurement system, and which define one or more trigger branches used to form a sequence level of the trigger definition.

35. The method of claim 34, further comprising the step of:
e) displaying in said trigger descriptor region a second trigger function descriptor visually associated with a second trigger function name in said first of said three regions.

* * * * *

UNITED STATES PATENT AND TRADEMARK OFFICE
CERTIFICATE OF CORRECTION

PATENT NO.   : 6,396,517 B1
DATED        : May 28, 2002
INVENTOR(S)  : Douglas James Beck, Clarence Keith Griggs, Jeffrey Erickson Roeca, Jeffrey John Haeffele and Mason Bradfield Samuels It is certified that error appears in the above-identified patent and that said Letters Patent is hereby corrected as shown below:

Column 3,
Line 64, delete "electable" and insert therefor -- selectable -- (PTO)

Column 5,
Line 30, after "Figure" add -- 4 --

Column 18,
Line 50, delete "in a"

Signed and Sealed this

Twelfth Day of November, 2002

Attest:

Attesting Officer

JAMES E. ROGAN
Director of the United States Patent and Trademark Office